(12) United States Patent
Nitta et al.

(10) Patent No.: US 6,415,427 B2
(45) Date of Patent: Jul. 2, 2002

(54) METHOD AND APPARATUS FOR GLOBAL ROUTING, AND STORAGE MEDIUM HAVING GLOBAL ROUTING PROGRAM STORED THEREIN

(75) Inventors: Izumi Nitta; Hidetoshi Matsuoka, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/800,490

(22) Filed: Mar. 8, 2001

Related U.S. Application Data

(63) Continuation of application No. PCT/JP98/05815, filed on Dec. 22, 1998.

(51) Int. Cl.[7] .............................................. G06F 17/50
(52) U.S. Cl. ....................................................... 716/10
(58) Field of Search ......................................... 716/2–19

(56) References Cited

U.S. PATENT DOCUMENTS 6,110,222 A  *  8/2000  Minami ........................ 716/9

FOREIGN PATENT DOCUMENTS

| JP | 62-39024 | 2/1987 |
|----|----------|--------|
| JP | 2-244280 | 9/1990 |

* cited by examiner

*Primary Examiner*—Matthew Smith
*Assistant Examiner*—Thuan Do
(74) *Attorney, Agent, or Firm*—Staas & Halsey LLP

(57) ABSTRACT

A global routing method acquiring global routing between net terminals of cells placed on a VLSI chip. First, a Steiner tree is generated without any of constraints such as layers, prohibition and a wiring capacity as an initial solution. Then, partial correction of the Steiner tree is repeated so as not to increase a line length as far as possible in consideration of constraints such as a prohibiting region, a wiring capacity and layers based on the initial solution of the Steiner tree to obtain the global routing. The Steiner tree is corrected generating a path collection obtained by dividing the Steiner tree into a plurality of paths each having at least a Steiner point, as a value, being an intersection of 3 or more branches.

15 Claims, 16 Drawing Sheets

FIG. 10

52 PATH LIST

| PATH | START POINTS | END POINTS | BRANCHES |
|------|--------------|------------|----------|
| p1 | t1 | s1 | e1 |
| p2 | t4 | s1 | e2, e3 |
| p3 | t1 | s2 | e4 |
| p4 | t2 | s2 | e5 |
| p5 | t3 | s2 | e6 |

F I G. 1 2 A
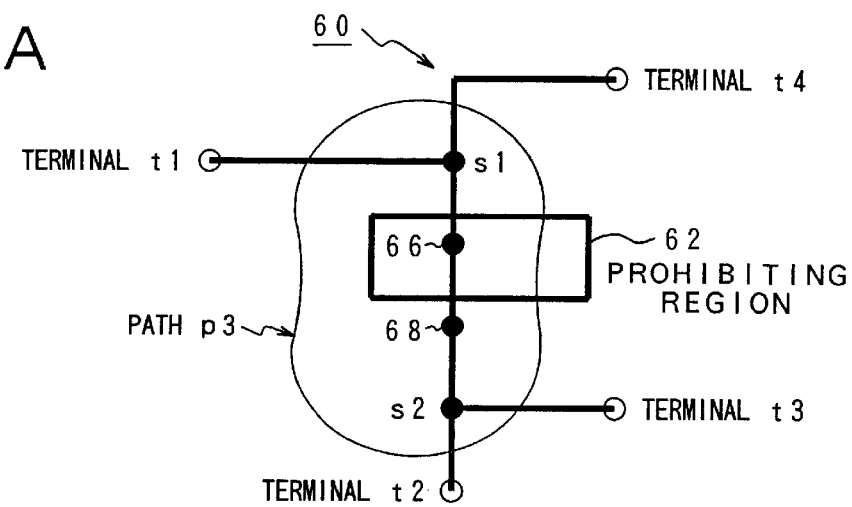
F I G. 1 2 B
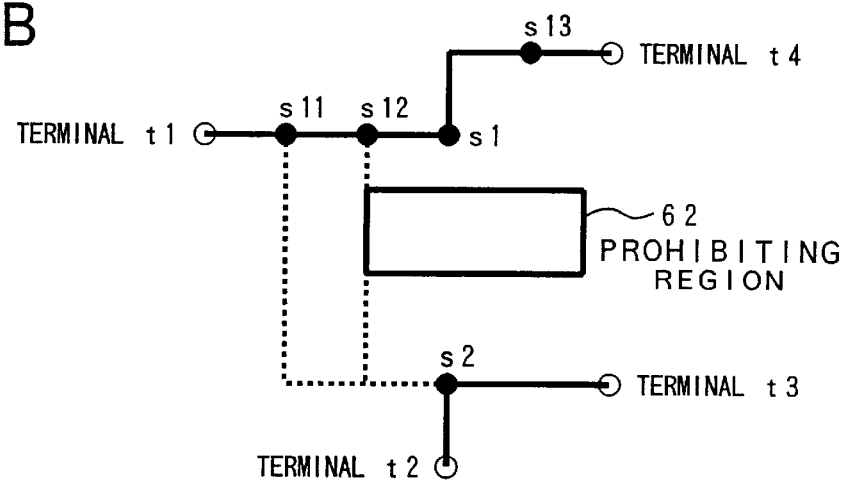
F I G. 1 2 C
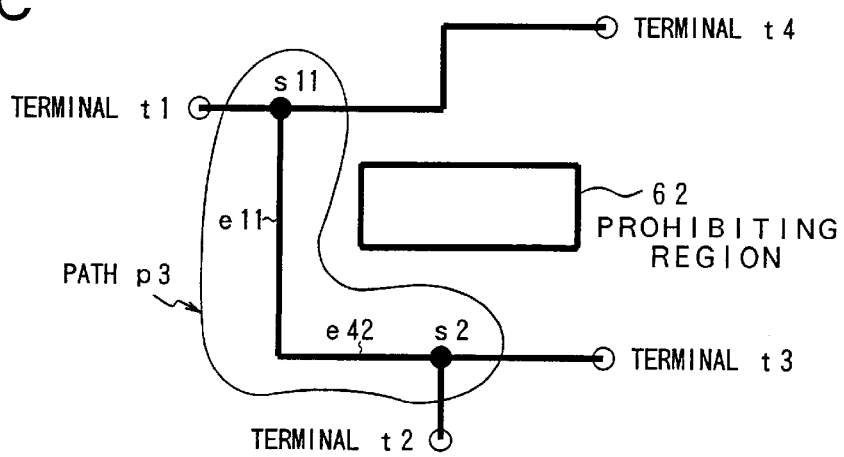

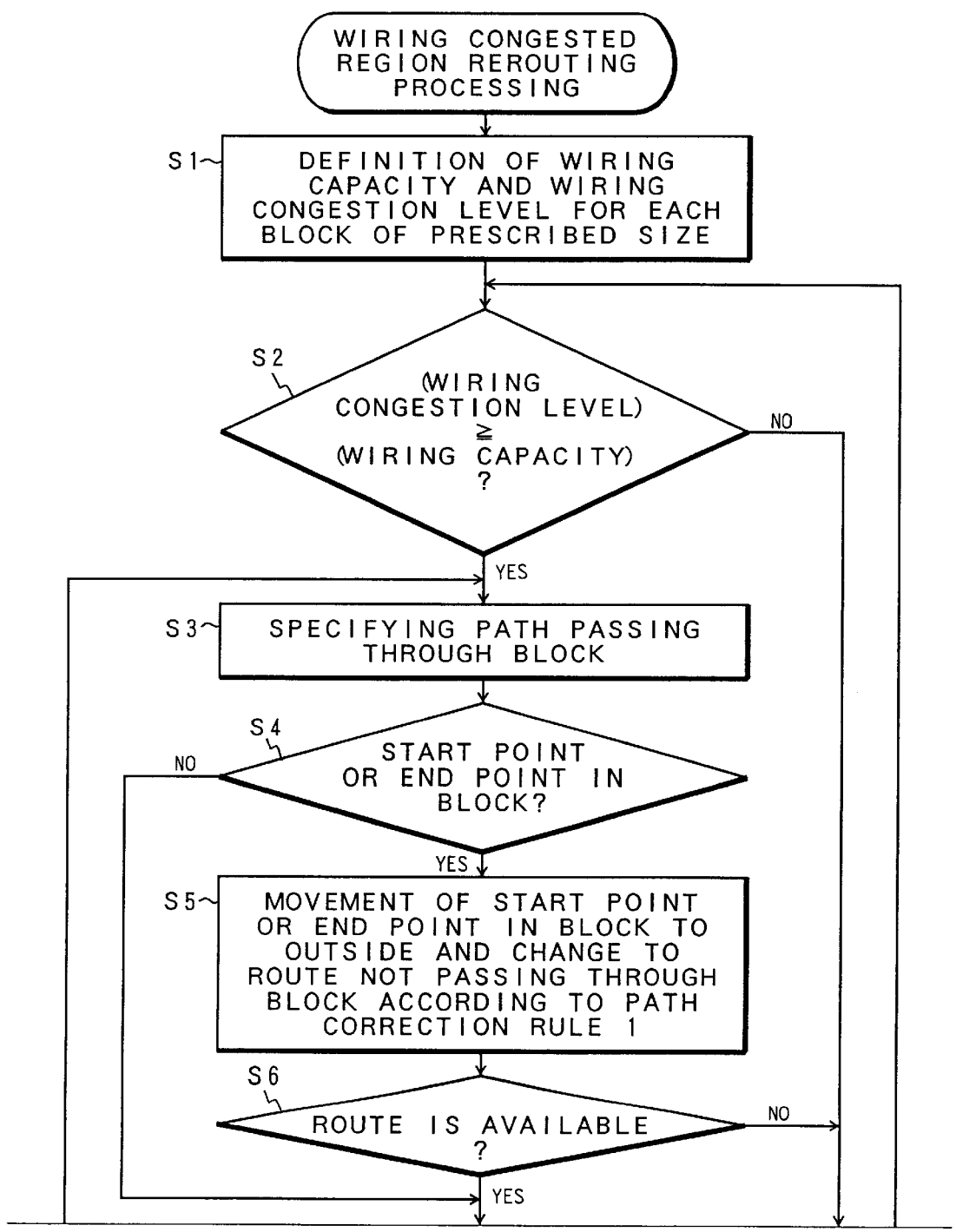
FIG. 13A

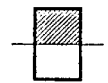
FIG. 15A
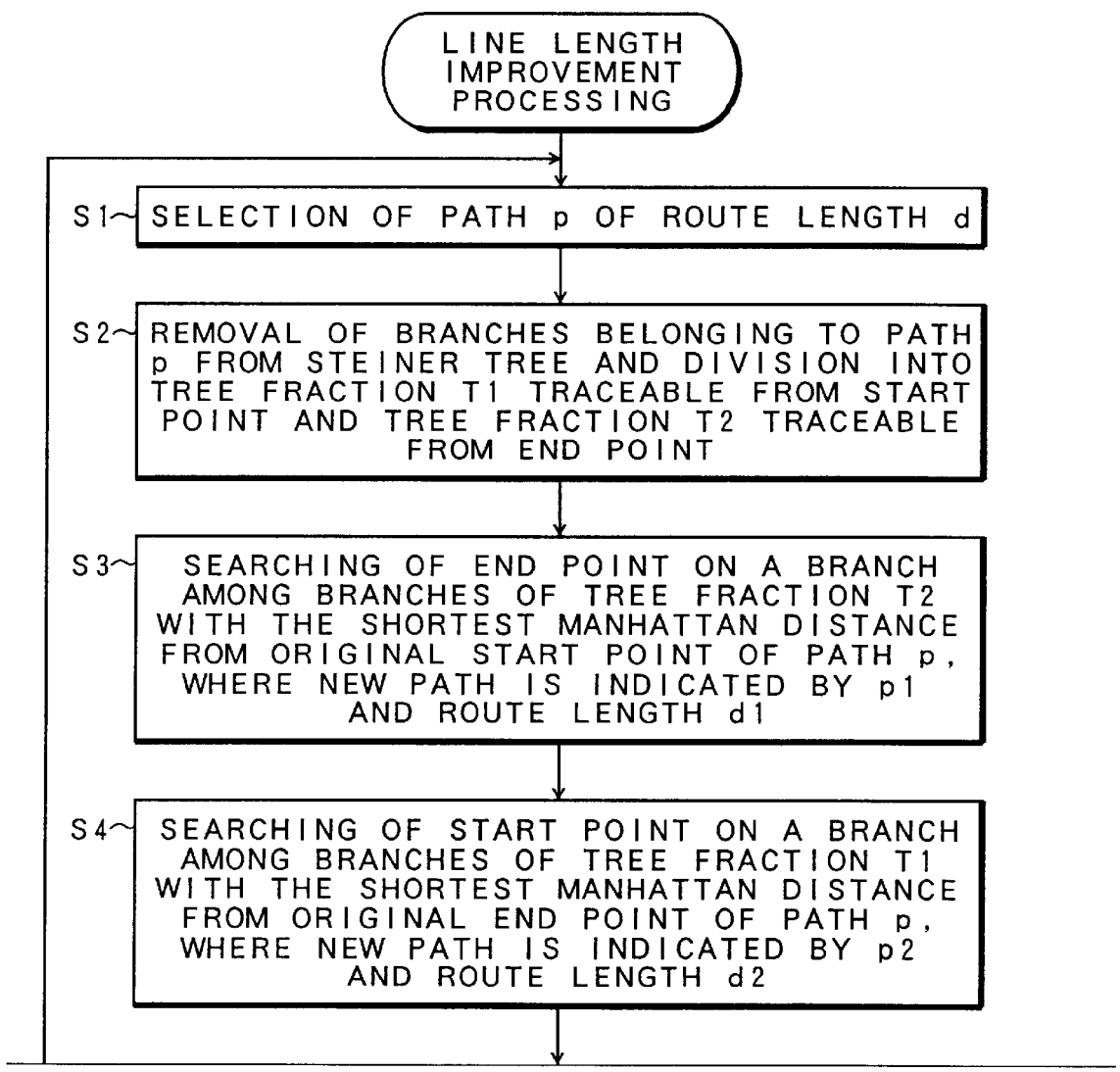

FIG. 15B
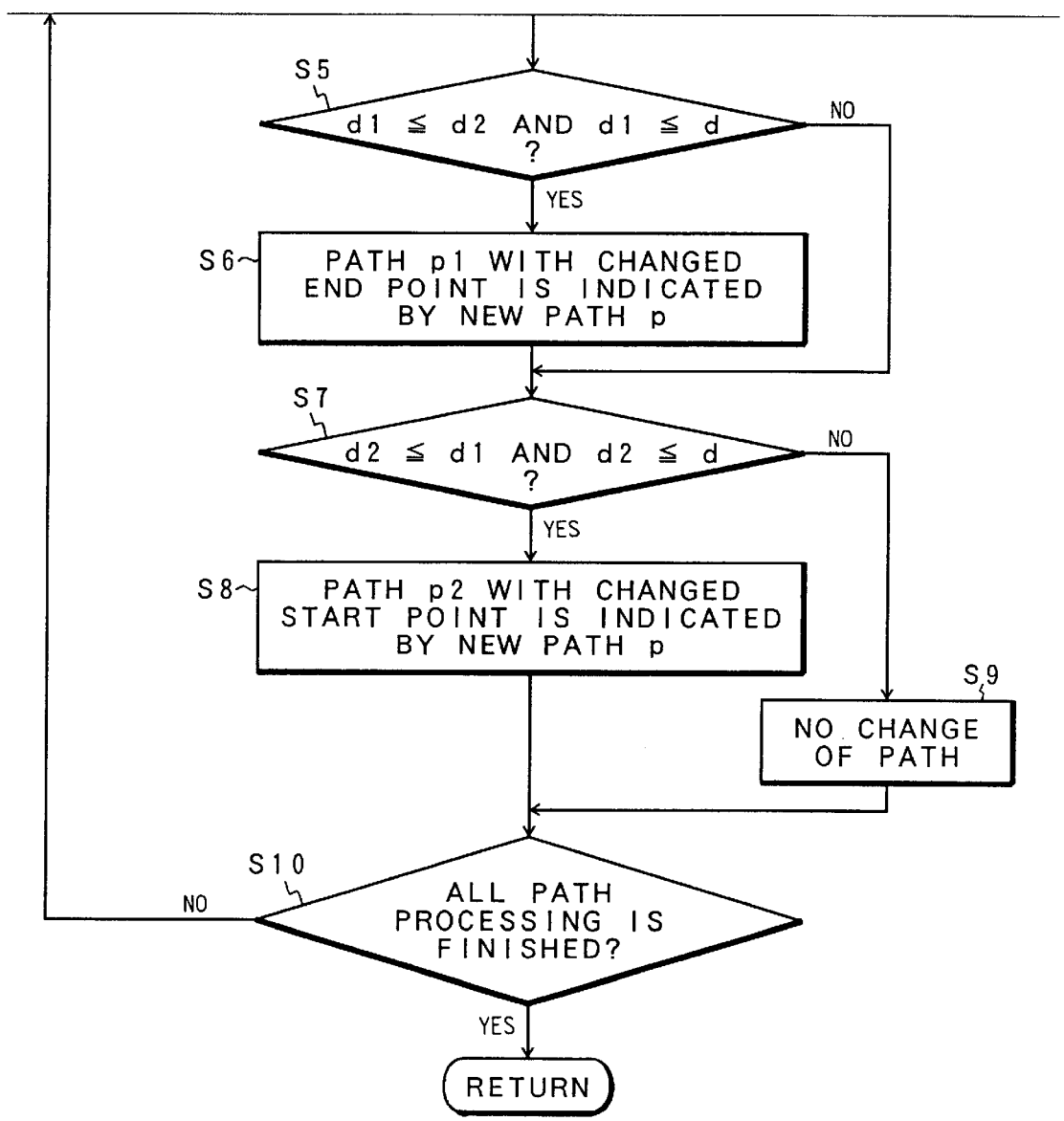

METHOD AND APPARATUS FOR GLOBAL ROUTING, AND STORAGE MEDIUM HAVING GLOBAL ROUTING PROGRAM STORED THEREIN

This application is a continuing application, filed under 35 U.S.C. §111(a), of International Application PCT/JP98/05815, filed Dec. 22, 1998.

TECHNICAL FIELD

The present invention relates to a method and apparatus for global routing performed prior to detailed routing in computer-aided automatic layout design of LSI and VLSI and a storage medium, readable by a computer, having a global routing program stored therein, and particularly, to a method and apparatus for global routing used in order to search the minimum cost routing between net terminals using a Steiner tree and a storage medium, readable by a computer, having a global routing program stored therein.

BACKGROUND ART

In a CAD system used for automatically designing a large scale semiconductor integrated circuit such as LSI and VLSI using a computer, firstly, a logical design is performed that determines cells such as AND and OR therebetween and nets connecting the cells therebetween; secondly, an automatic design for cell layout placing the cells on a chip is performed based on a netlist obtained by the logical design and finally, routing is performed that determines wires connecting nets between the cells placed on the chip. The routing is divided into two phases: one is global routing in which net routing is determined without considering timing, delay and so on and the other is detailed routing in which actual routing on the chip is determined in consideration of timing, delay and others. Along with progress in circuit design technology in recent years, improvement on degree of integration in VLSI and increase in circuit scale have been tremendous. For this reason, automatic layout design faces requirement for high speed processing of a large scale circuit.

Simple description will be given, here, of a definition of a global routing problem, an object of the present invention. Consider a region on a grid structure called a grid graph. A grid graph is obtained by a procedure in which a chip region is divided into cell blocks with horizontal and vertical lines and thus formed rectangular cells are represented by vertices and the vertices are connected to form a grid structure, and a terminal of a layout cell is expressed by a black point on a grid structure. Intersections of the horizontal and vertical lines of the grid graph are called grids. A grid size is a total number of grids and in a case where the number of grids in the vertical direction is v counts and the number of grids in the horizontal direction is h counts, the grid size is a value of (h×v). In a case of FIG. 1, h=6 and v=6, so a grid size is 36. A global routing problem is to generate line segments on a grid structure so as to connect terminals t1, t2 ad t3 of a net N therebetween with the line segments. In a case where a plurality of wiring layers exist, each line segment is allotted on a route of the lowest cost. A cost function is generally a wirelength given by a total sum of lengths of line segments and the cost is minimized. Constraints on global routing is not to pass through regions 100 and 102 shadowed with hatching, which regions are a wiring prohibiting region or a highly wiring congested region.

Concise description will be given of well known ones of global routing methods below:

Typically, a maze method and a line search method are named as first two which are procedures regarding a net with two terminals. The maze method is effected as follows: As shown in FIG. 2, one terminal t1 is a source and the other terminal t2 is a target, and search is performed in a way such that a wave is propagated from the source t1. At first, the source t1 is labeled with [0]. A value of the label is a distance from the source t1. Then, a vertex adjacent to the source t1 is labeled with [1] and a vertex adjacent to the vertex of label [1] is labeled with [2]. Such a procedure is advanced such that a wave propagates. The process is repeated till the wave reaches the target t2 or till the wave is not propagate any longer. A strong point of the maze method is that the shortest route can be obtained even in consideration of a region where no wiring can be effected. Furthermore, a calculation time is dependent on a grid size, which is O(h×w) wherein a height is indicated by h and a width by w, and O( ) is Order( ) for short. For this reason, the a maze method increases a calculation cost with increase in scale of a circuit and therefore, increase in grid size. Moreover, a memory size for use in storing labels is also dependent on a grid size of a chip.

A line search method is such that as in FIG. 3, line segments are generated from the source t1 and the target t2 and the line segments are added into lists called an s list and a t list, respectively. A line segment is elongated as long as no obstacle is encountered by the line segment. Search is terminated where a line segment of the s list and a line segment of the t list are encountered by each other. In FIG. 3, line segments are elongated such that line segments s1, s2 and s3 are added to the s list and line segments s4, s5 and s6 are added to the t list and such a process is terminated where the line segments s2 and s4 are encountered by each other to find a route. The line search method reduces the use of a memory by employing line segments instead of grids. In this method, a calculation cost is dependent on the number of line segments L, which is O(L). Such maze and line search methods are capable of not only considering regions 100 and 102, which regions are a wiring prohibiting region or a highly wiring congested region as obstacles, but performing a multilayer wiring.

Extended methods of the maze method and the line search method are employed for a multiterminal net with three or more terminals, but such an extended method has a defect of falling into a local solution; therefore, a method using a Steiner tree of FIG. 4 is more excellent in that a high quality solution is obtained. The method using a Steiner tree generates a Sterner tree 104 called RST (rectilinear Steiner tree). A problem of searching the Steiner tree 104 with the minimum cost cannot be solved in a significant time and is of a non-polynominal order complexity that solutions increases in an explosive manner or of no solution being obtainable in polynominal time, but some heuristic methods have been proposed for the problem. A proposed method known is such that when the number of nets is N by definition, the method requires a calculation time and a used memory amount up to the order of $O(N^3 \log N)$. A general method using a Steiner tree is performed such that a Steiner tree is generated without any of constraints and in no consideration of obstacles, and when routes of branches of the Steiner tree are obtained, the obstacles are avoided using a maze method or the like.

In a method dependent on a grid size such as a maze method, a problem arises since a calculation time and a used memory amount are increased in a large scaled circuit. On the other hand, the method using Steiner tree has dependency of a calculation time on the number of net terminals.

The number of net terminals is at the most several hundreds in a practical circuit. In contrast to this, a grid size of a wiring region amounts to at least several millions or more. Therefore, the method using a Steiner tree is more advantageous in calculation time and used memory amount compared with the maze method. In a general algorithm for generating a Steiner tree, however, no consideration is given to layers, prohibition, a wiring capacity; therefore, such constraints are left up to detailed routing. In this case, a problem imposed on the detailed routing becomes hard and contrary to the expectation, a possibility arises of increasing a calculation time for all the wiring.

DISCLOSURE OF INVENTION

According to the present invention, provided are a method and apparatus for global routing capable of obtaining a high quality solution for global routing that alleviates a load on detailed routing using a Steiner tree, and a storage medium, readable by a computer, having a global routing program stored therein.

The present invention is a global routing method obtaining global routing between net terminals of cells placed on a chip and the method includes: a Steiner tree generating step of generating a Steiner tree having been generated without any of constraints as an initial solution: and a correcting step of repeating partial correction of the Steiner tree so as not to increase a line length as far as possible in consideration of constraints based on the initial solution of the Steiner tree to obtain the global routing, wherein in the Steiner tree generating step, a Steiner tree is generated, as an initial solution, without any of constraints such as layers, prohibition and a wiring capacity and in the correcting step, partial correction of the Steiner tree is repeated so as not to increase a line length as far as possible in consideration of a prohibiting region, a wiring capacity and layers. The present invention can achieve a result of the same quality as global routing by means of a maze method in consideration of an obstacle by performing a partial correction of a Steiner tree while taking constraints on wiring into consideration. Furthermore, calculation required for partial correction of a Steiner tree in the present invention is fundamentally coordinate computation, and a calculation time and a used memory amount are dependent on the number N of net terminals. Therefore, in a large scale circuit, the method of the present invention is more advantageous in calculation time and used memory amount compared with a maze method scanning a wiring region. Herein, the correcting step includes: a path collection generating step of generating a path collection obtained by dividing the Steiner tree into a plurality of paths each having at least a Steiner point, as a value, being an intersection of 3 or more branches; and a path correcting step of partially correcting the Steiner tree by correction of a path in consideration of constraints for the path collection of the Steiner tree. In this path collection, when the number of terminals is N, and the number of Steiner points is an (N) order, the number of branches of the Steiner tree is $e_n$ by definition, a calculation time for division to paths is of the order of $O(e_n^2)$ since the time is suppressed by an operation for determining whether or not each terminal point of a branch is a Steiner point. Moreover, the number $e_n$ of branches of the Steiner tree is of the order of $O(N)$ and a calculation time for division to paths is of $O(N^2)$. Furthermore, the number of paths generated is suppressed to $O(N)$. The path correcting step includes a prohibiting region rerouting step of changing a path passing through a prohibiting region to a path not passing through the prohibiting region for a path collection of a Steiner tree. The prohibiting region rerouting step has the following steps, to be concrete:

I. determining whether a start point or end point of a path resides in or a route thereof passes through a prohibiting region;

II. if neither reside in nor passing through the prohibiting region, then terminating the process;

III. if the start point or end point or the path resides in the prohibiting region, then moving the start point or end point to outside the prohibiting region and thereafter, renewing a path collection, or if neither being found outside the prohibiting region, then changing no path and terminating the process; and IV. if a path passes through a prohibiting region, then changing a route thereof so as not pass through the prohibiting region.

The prohibiting region rerouting step includes: a first correcting step and a second correcting step. In the first correcting step, when a start point in a prohibiting region is moved to outside the region, points on branches of a Steiner tree traceable from an original start point is selected as prospective points for a new start point of a movement destination or points on all branches of the Steiner tree traceable from an original end point is selected as prospective points for a new end point of a movement destination, and a prospective point, being outside the prohibiting region, and having the shortest line length is selected among the prospected points as a start point or endpoint to change a path. In this case, a calculation time for correcting one path is of $O(e_n)=O(N)$. In the second correcting step, when a route passes through a prohibiting region, a path is changed selecting a route passing through a space outside the prohibiting region without changing both of the start and end points so as not to increase a line length as far as possible. In order not to increase a line length of a path compared with the original Steiner tree in the second correcting step, it is only required to select a route passing through a rectangle encircling the start and end point of the path. In a case where it is impossible for a path to pass through a space within the rectangle due to a constraint from the prohibiting region, a line length increases. Moreover, by predetermining routing patterns within a rectangle, a calculation time can be limited to $O(1)$. The path correcting step includes a wiring congested region rerouting step of changing a path passing through a wiring congested region having the number of wires exceeding a wiring capacity to a path not passing through the wiring congested region so as to ensure the number of wires equal to or less than the wiring capacity in the wiring congested region. The wiring congested region rerouting step has a detailed procedure including the steps of:

I. defining a wiring capacity indicating the maximum of the number of wires capable of passing through each of blocks obtained by dividing a wiring region into the blocks each of a prescribed area and a wiring congestion level indicating the number of wires currently passing through each of the blocks;

II. if a wiring congestion level of a block is equal to or less than a wiring capacity thereof, then terminating the process;

III. if a wiring congestion level of a block exceeds a wiring capacity thereof, then changing a first path whose start point and end point are outside a block, and passing through the block to a second path finding a route not passing through the block without changing a start point and end point of the first path, or if no route not passing through the block is found, maintaining the first path as is originally;

IV. if one of a start point and endpoint of a path resides within a block and the other resides outside the block, changing the path finding a terminal point outside said block instead of a terminal point within said block and thereby finding a route not passing through the lock, or if neither the terminal point nor the route is found, maintaining the path as is originally;

V. if both of a start point and end point of a path resides in a block, maintaining the path as is originally; and VI. after a path is corrected, recalculating a wiring congestion level of a block and repeating the process till the wiring congestion level thereof decreases to a value equal to or less than a wiring capacity thereof.

This wiring congested region rerouting step can also include: a first correcting step and a second correcting step. In the first correcting step, when a start point or end point of a path resides in a wiring congested block, points on branches of a Steiner tree traceable from an original start point or end point are selected as prospect points for a new start point or new end point of a movement destination, and a path is changed selecting a prospect point, being outside the block, and having the shortest line length among the prospective points for the new end point or end point to find a route not to passing through the block. In the second correcting step, when a route passes through a block, a path is changed selecting a route passing through a space outside the block so as not to increase a line length as far as possible without changing a start point and end point thereof. The path correcting step includes a line length improving step of changing a path so as to improve a line length of the path after partial correction of a Steiner tree under constrains for a path collection of the Steiner tree. The line length improving step has a detailed procedure including the steps of:

I. removing branches belonging to a path to be processed from a Steiner tree to divide the branches into a first tree fraction T1 which is a collection of branches traceable from a start point and a second tree fraction T2 which is a collection of branches traceable from an end point;

II. generating a first prospective path finding an end point on a branch, having the shortest Manhattan distance, among branches of the tree fraction T2 from the original start point of the first tree fraction T1;

III. generating a second prospective path finding a start point on a branch, having the shortest Manhattan distance, among branches of the tree fraction T1 from the original end point of the second tree fraction T2;

IV. if a distance d1 of the first prospective path is equal to or less than a distance d2 of the second prospective path and equal to or less than a distance d of the pass to be processed, that is, if d1<d2 and d1<d, renewing a path collection with the first prospective path whose end point has been changed as a new path;

V. if a distance d2 of the second prospective path is equal to or less than a distance d1 of the first prospective path and equal to or less than a distance d of the pass to be processed, that is, if d2<d1 and d2<d, renewing the collection path with the second prospective path whose end point has been changed as a new path; and VI. If distances d1 and d2 of the first and second prospective paths, respectively, are equal to or more than a distance of the path to be processed, that is if $d1 \geq d$ and $d2 \geq d$, maintaining the path as is originally without changing a start point and end point thereof.

Furthermore, the present invention provides a global routing apparatus acquiring global routing between net terminals of cells placed on a chip. The global routing apparatus includes: a Steiner tree generating unit generating a Steiner tree having been generated without any of constraints such as layers, prohibition and a wiring capacity as an initial solution; a path collection generating unit generating a path collection obtained by dividing the Steiner tree into a plurality of paths each having at least a Steiner point, as a value, being an intersection of three or more branches; and a path correcting unit obtaining global routing repeating partial correction of the Steiner tree with correction of a path in consideration of the constraints so as not to increase a line length as far as possible for the path collection of the Steiner tree. The path correcting unit of the global routing apparatus includes: a prohibiting region rerouting processing unit changing a path passing through a prohibiting region to a path not passing through the prohibiting region for a path collection of the Steiner tree; a wiring congested region rerouting processing unit changing a path passing through a wiring congested region having the number of wires exceeding a wiring capacity to a path not passing through the wiring congested region so as to ensure the number of wires equal to or less than the wiring capacity in the wiring congested region for the path collection of the Steiner tree; and a line length improvement processing unit changing a path so as to improve a line length of the path after partial correction of said Steiner tree under the constraints for the path collection of the Steiner tree.

Furthermore, the present invention provides a storage medium, readable by a computer, having a global routing program stored therein, the program acquiring global routing between net terminals of cells placed on a chip. The storage medium includes: a Steiner tree generating module generating a Steiner tree having been generated without any of constraints such as layers, prohibition and a wiring capacity as an initial solution; a path collection generating module generating a path collection obtained by dividing the Steiner tree into a plurality of paths each having at least a Steiner point, as a value, being an intersection of three or more branches; and a path correcting module obtaining global routing repeating partial correction of the Steiner tree with correction of a path in consideration of constraints so as not to increase a line length as far as possible for a path collection of the Steiner tree. Furthermore, the path correcting module of the storage medium includes: a prohibiting region rerouting processing module changing a path passing through a prohibiting region to a path not passing through the prohibiting region for a path collection of a Steiner tree; a wiring congested region rerouting processing module changing a path passing through a wiring congested region having the number of wires exceeding a wiring capacity to a path not passing through the wiring congested region so as to ensure the number of wires equal to or less than the wiring capacity in the wire congested region for the path collection of the Steiner tree; and a line length improvement processing module changing a path so as to improve a line length of the path after partial correction of a Steiner tree under the constraints for the path collection of the Steiner tree.

A calculation time for correction of a Steiner tree in such a global routing method of the present invention is only of the order of $O\{N^2(\log N)^2\}$ for a net with the number N of terminals. Besides, a calculation time of a combination of generation and correction of a Steiner tree as an initial solution is of the order of $O(N^3 \log N)$ though the time is dependent on a Steiner generating algorithm. The number of terminals is at the most $10^2$ and while in this case, a calculation time is $10^8$, a net having several hundreds of terminals is only several % of all the nets in a general circuit.

Moreover, a necessary memory capacity for preparing a path structure is O(N). On the other hand, a grid size is of the order ranging from $10^6$ to $10^8$. In a maze method, a calculation time for a grid size of (h×w) is O(h×w) and the calculation is repeated in times equal to the number of nets. Moreover, a memory is required for storing label values corresponding to a grid size. As a result, according to the present invention, realized is global routing with a short calculation time and a small used-memory amount.

BRIEF DESCRIPTION OF DRAWINGS

FIG. 10 is a descriptive table of a path list showing a path collection of FIG. 9;

FIGS. 12A to 12C are descriptive drawings for prohibiting region rerouting processing of the present invention;

FIGS. 13A and 13B are flow charts for wiring congested region rerouting processing of the present invention;

FIGS. 15A and 15B are flow charts for line length improvement processing of the present invention;

BEST MODE FOR CARRYING OUT THE INVENTION

Figure 5:
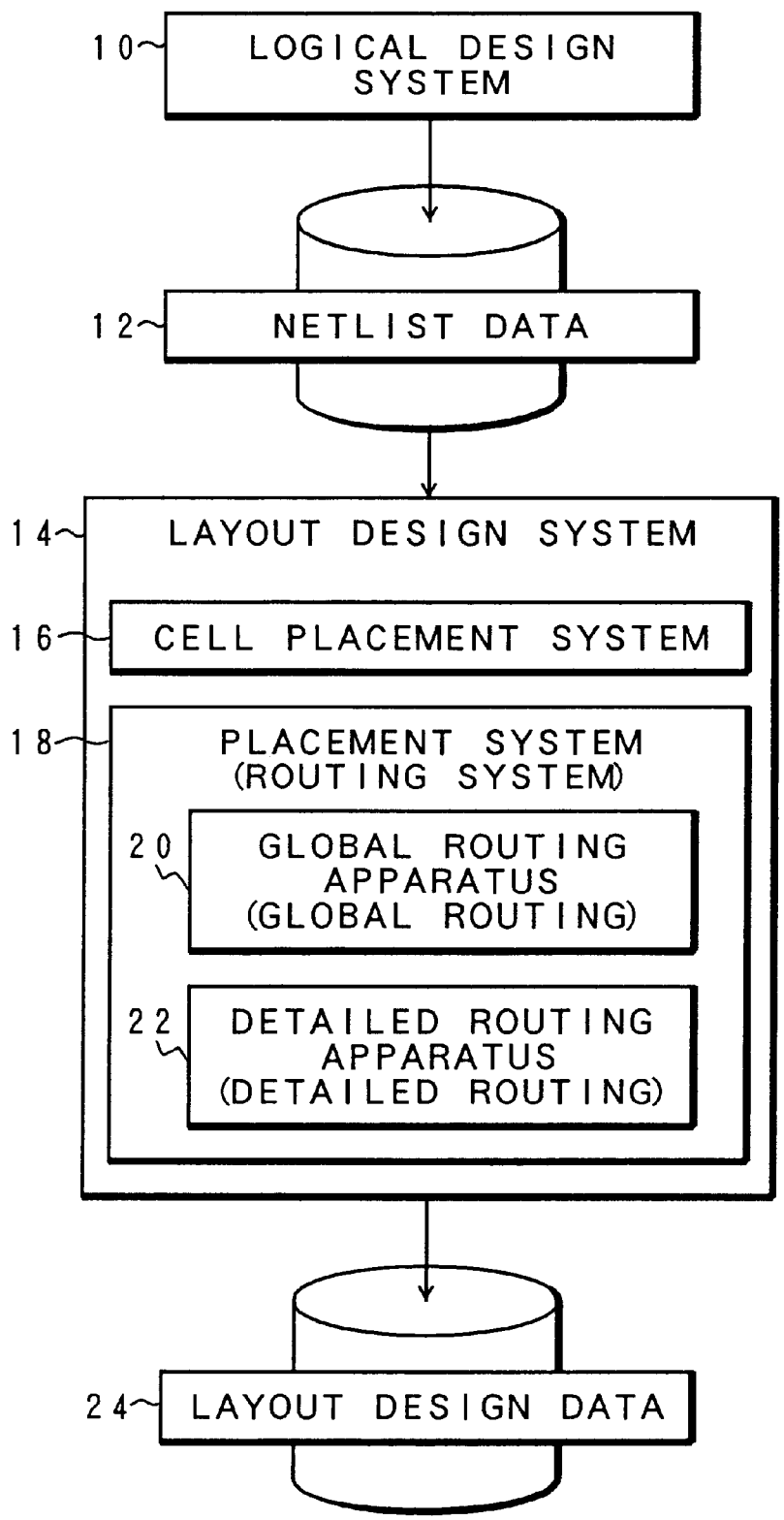
FIG. 5 is a block diagram of a VLSI automatic design system to which the present invention is applied.

FIG. 5 is a block diagram of an automatic design system for LSI and VLSI aided by a computer using a global routing technique of the present invention. This automatic design system includes: a logical design system 10; and a layout design system 14. The logical design system 10 uses information expressing contents of operation of a large scale integrated circuit to be designed as input and generates netlist data 12 which is logical connection information expressed by connection information between cells registered in a library. The layout design system 14 performs placement of cells on a chip and routing between the cells placed based on the netlist data 12 generated by the logical design system 10 to generate layout design data 24. Hence, the layout design system 14 includes: a cell placement system 16; and a routing system 19. The routing system 18 includes: a global routing apparatus 20 known as being used in global routing; and a detailed routing apparatus 22 known as being used in detailed routing, wherein global routing of the present invention is applied to the global routing apparatus 20.

Figure 1:
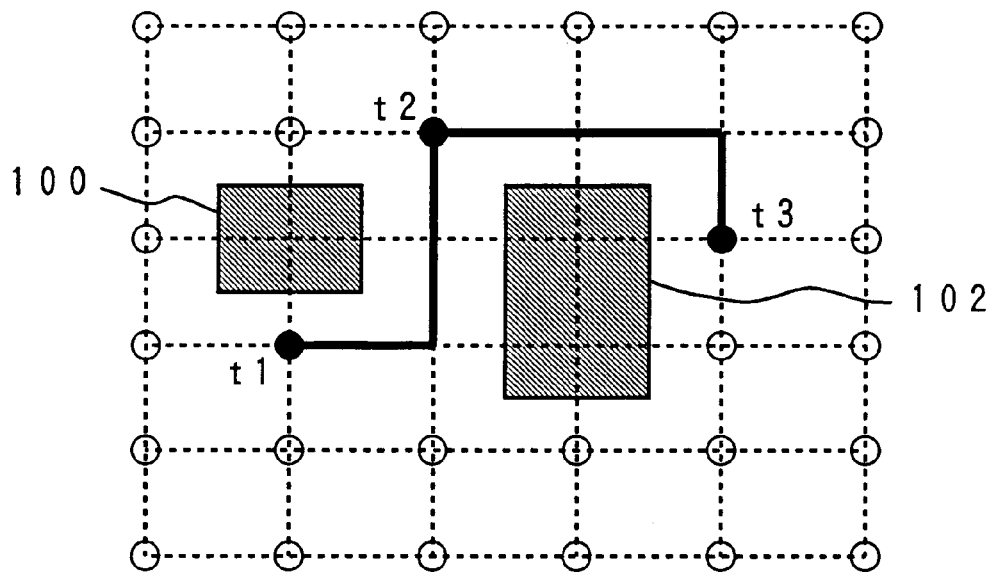
FIG. 1 is a descriptive diagram of a global routing problem using a grid graph.
Figure 6:
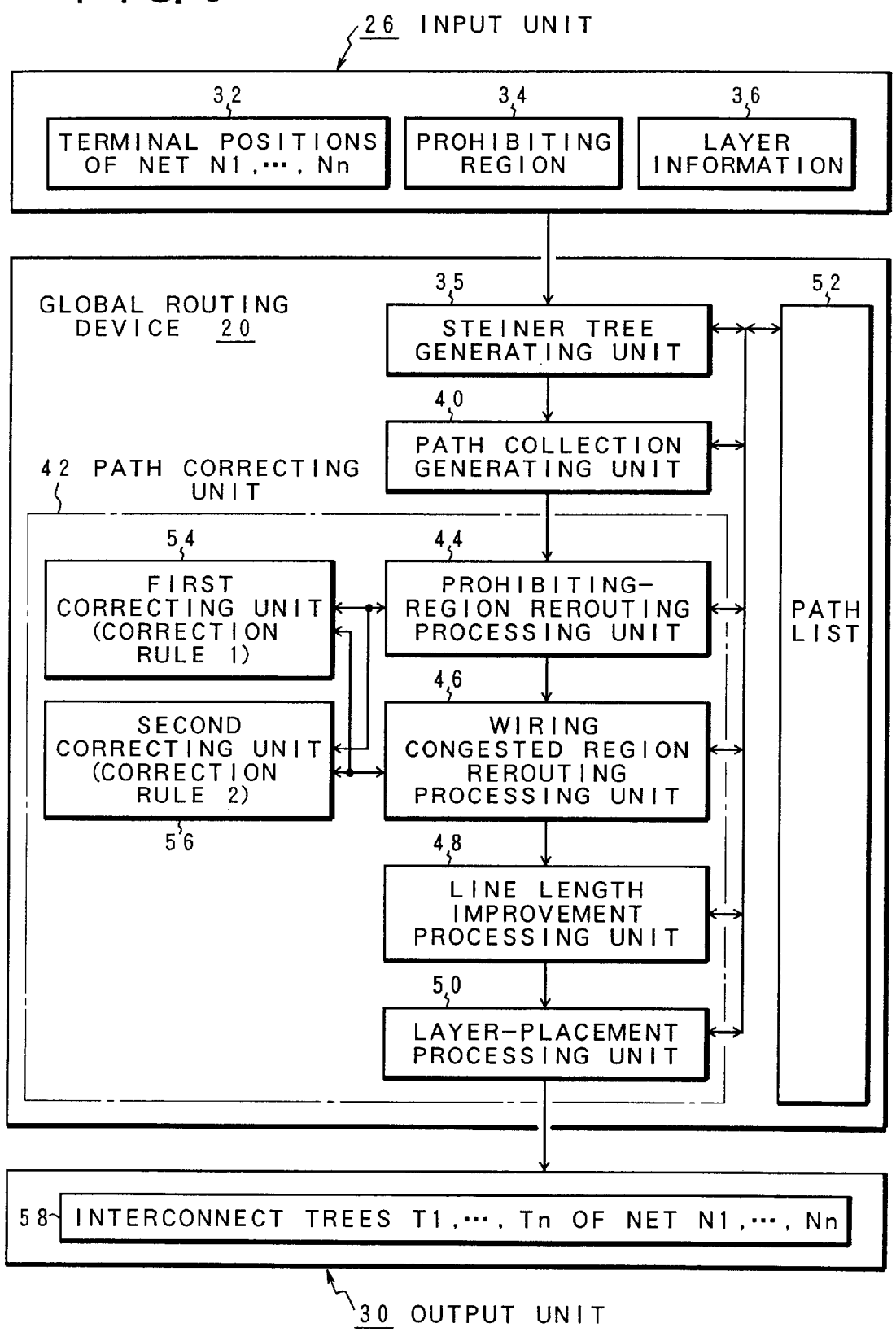
FIG. 6 is a functional block diagram of a global routing apparatus of the present invention.

FIG. 6 is a functional block diagram of the global routing apparatus 20 of FIG. 5. An input unit 26 is provided to the global routing apparatus 20 and inputted are terminal positions 32 of nets N1 to Nn based on netlist data 12 generated in the logical design system 10 of FIG. 5, and datas of prohibiting regions 34 and layer information 36. The global routing apparatus 20 includes: a Steiner tree generating unit 38, a path collection generating unit 40, a path correcting unit 42, and a path list storage unit 52. The path correcting unit 42 includes: a prohibiting region rerouting processing unit 44, a wiring congested region rerouting processing unit 46, a line length improvement processing unit 48, a layer placement processing unit 50, a first correcting unit 52 and a second correcting unit 56. The global routing apparatus 20 adopts a Steiner tree generated based on the terminal positions of the nets N1 to Nn without any of constraints as an initial solution, performs partial correction of the Steiner tree while considering constraints such as the wiring prohibiting region, the wiring congested region and the layer-placement, and thereby acquires a result of global routing having a quality equal to that of a global routing like FIG. 1 obtained considering obstacles in a maze method. Calculation required for partial correction of a Steiner tree in the global routing apparatus 20 of the present invention is fundamentally coordinate calculation and a calculation time and a used memory amount are dependent on the number of net terminals. Therefore, in a large scale circuit, global routing of the present invention is much more advantageous in calculation time and used memory amount compared with a maze method handling a wiring region. Global routing obtained as a result of the partial correction in consideration of the constraints for the initial solution of a Steiner tree in the global routing apparatus 20 is outputted to an output unit 30 as wiring trees T1 to Tn58 of the nets N1 to Nn.

Figure 2:
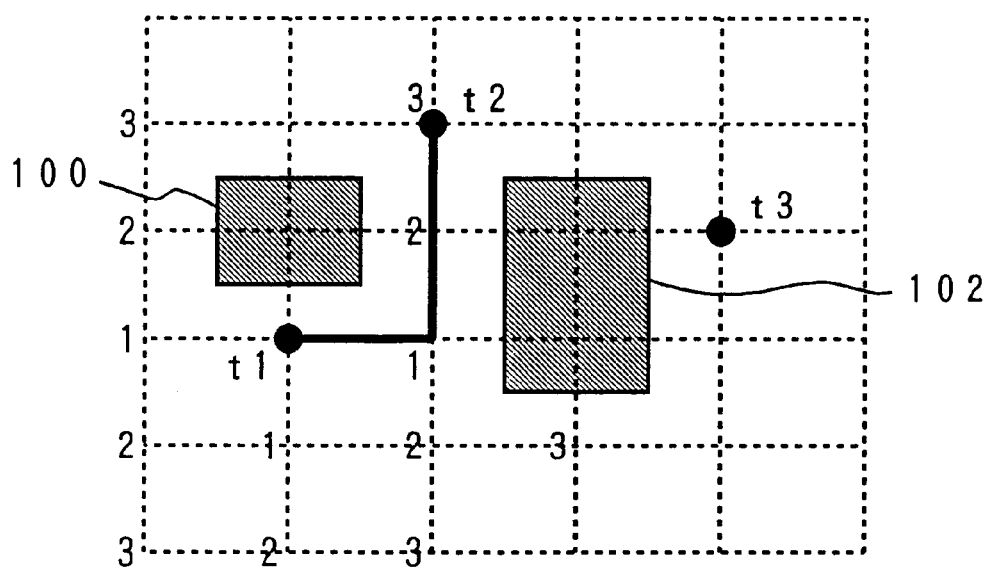
FIG. 2 is a descriptive diagram of a maze method.
Figure 3:
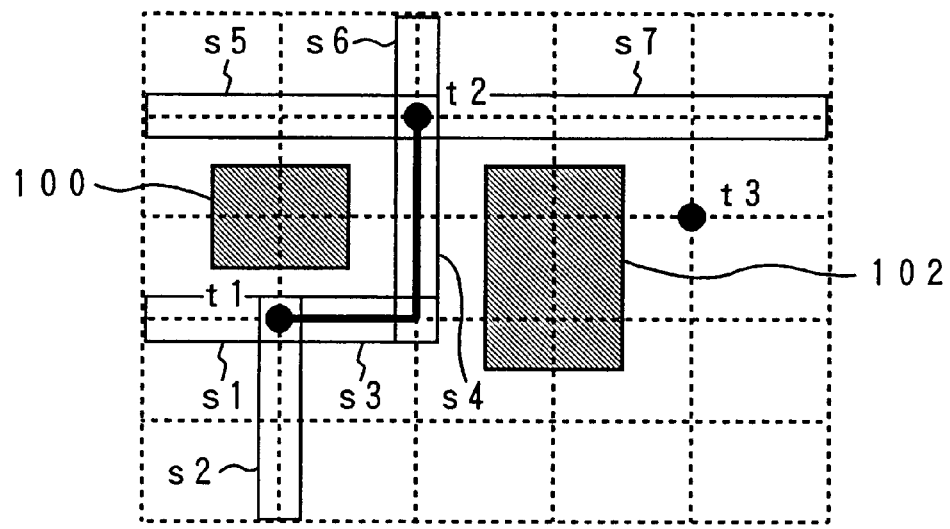
FIG. 3 is a descriptive diagram of a line search method.
Figure 4:
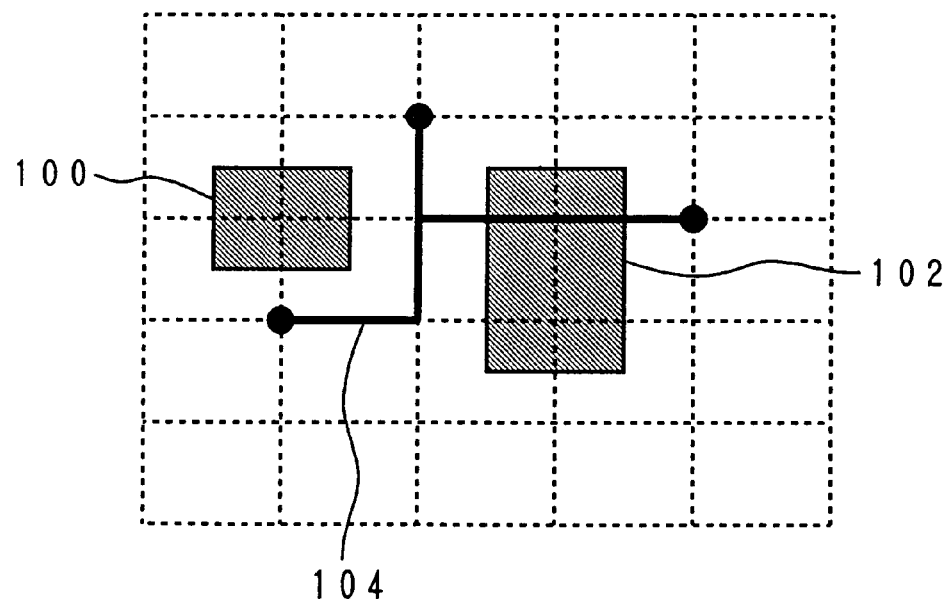
FIG. 4 is a descriptive diagram of a method using a Steiner tree.
Figure 7:
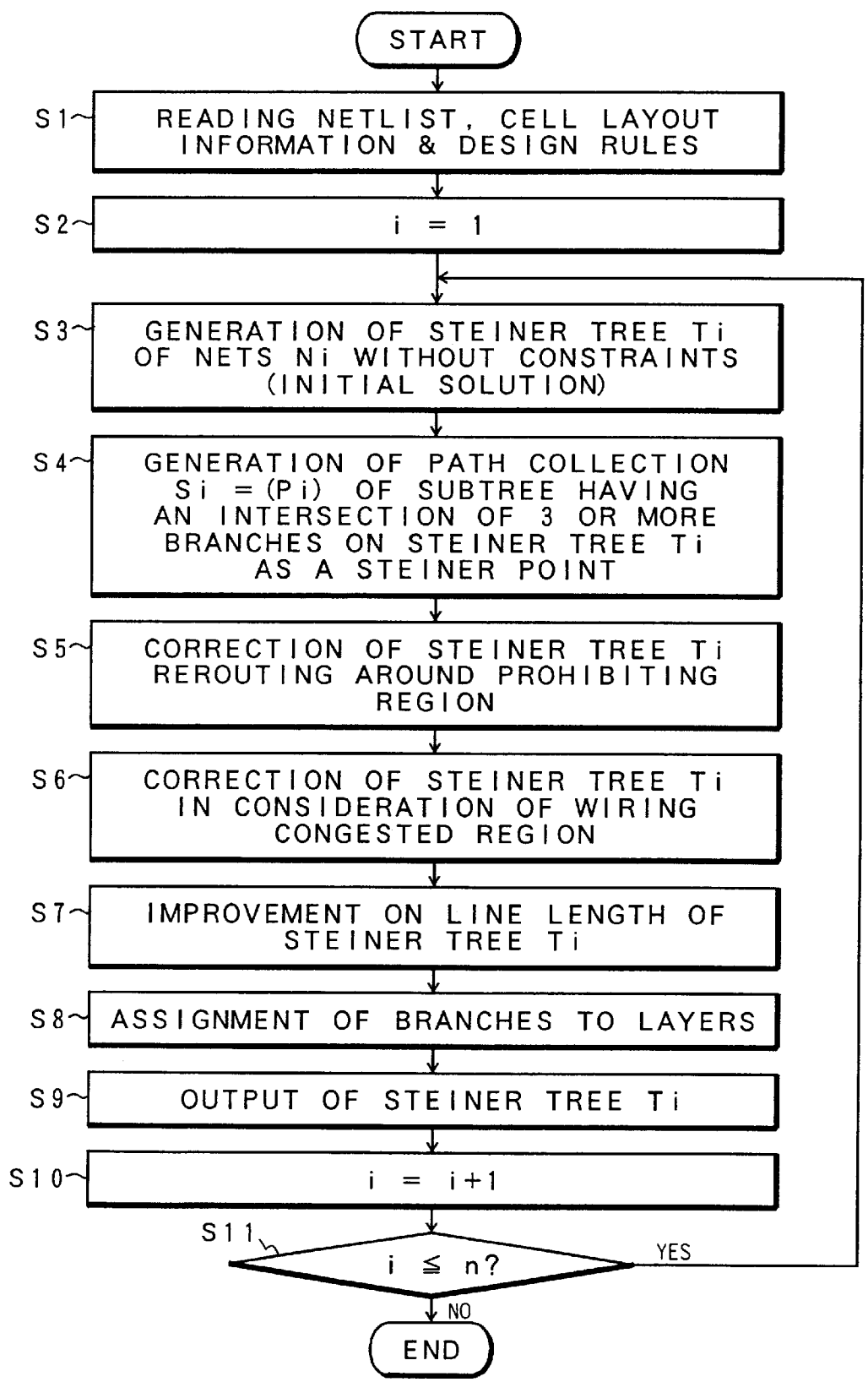
FIG. 7 is a flow chart for a global routing processing of the present invention.

FIG. 7 is a flow chart for global routing processing of the present invention in the global routing apparatus 20 of FIG. 6. In step S1, first of all, read are the netlist, cell layout information and design rules. Then, in step S2, a process counter i is initialized to i=0 and thereafter, in step S3, the Steiner tree T1 of the net N1 is generated by the Steiner tree generating unit 38 of FIG. 2 for a net Ni=N1 specified with a process counter i1 without any of constraints of a layer placement prohibiting region and a wiring capacity and the Steiner tree T1 generated without any of the constraints is adopted as an initial solution of a global routing problem.

Figure 8:
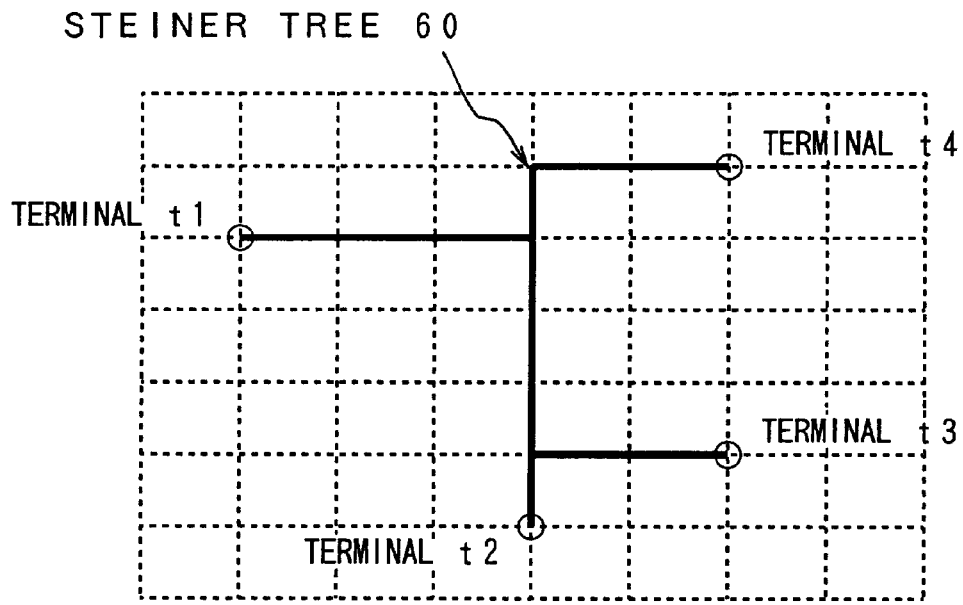
FIG. 8 is a descriptive diagram of a Steiner tree generated as an initial solution in the present invention.

FIG. 8 shows a Steiner tree Ti of a net Ni generated without any of the constraints in step S3 of FIG. 7 in which the Steiner tree Ti having 4 terminals t1, t2, t3 and t4 is generated on a grid graph. A generating algorithm for the Steiner tree Ti is described in, for example, J. Cong et al., "Topology optimization for total wirelength minimization, INTEGRATION, the VLSI Journal 21(1996) 1–94, Section 3. 1, pp. 17 to 21, ELSEVIER, 1996.

Figure 9:
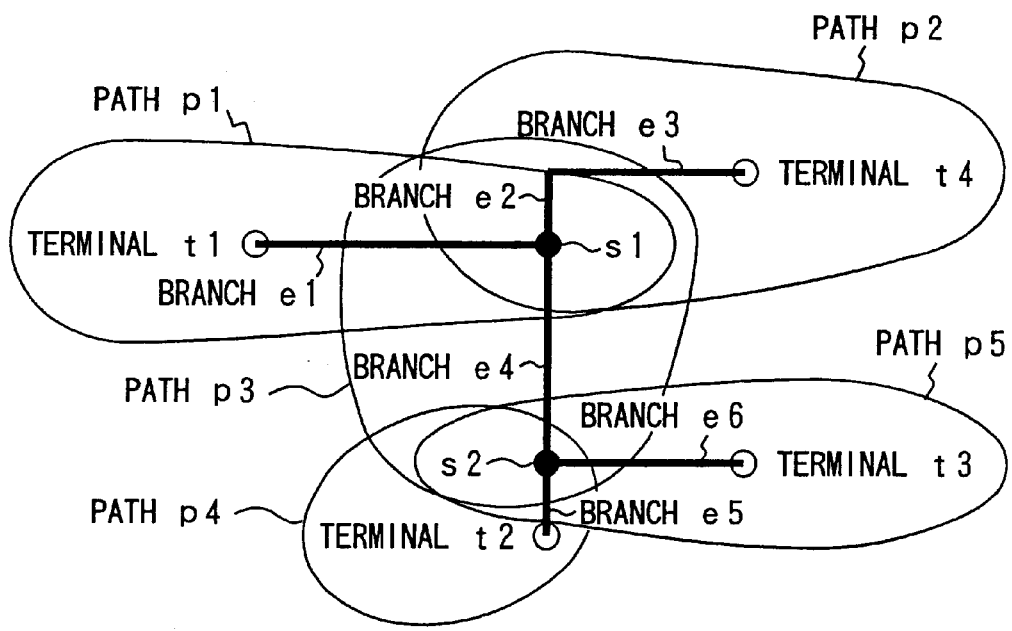
FIG. 9 is a descriptive drawing of a sub-Steiner tree obtained by dividing the Steiner tree into paths each with the Steiner point of FIG. 8.

Next, in step S4 of FIG. 7, generated is a path collection Si=(Pi) which is a collection of subtrees each having an intersection of three or more branches on the Steiner tree T1 as a Steiner point for an initial solution of the Steiner tree T1 generated in step S3. FIG. 9 is a descriptive drawing for generation processing of a path collection as a subtree collection in step S4, which is based on the Steiner tree 60 of FIG. 8. Now, Steiner points each being an interconnection of three or more branches are obtained on the Sterner tree 60.

In this case, two Steiner points s1 and s2 are obtained. In the present invention, a subtree such as having the Steiner points s1 and s2 is called a path. For this reason, a path is constituted of the following elements:

I. a start point of the path: a Steiner point or a leaf (terminal) of an original Steiner tree;
  II. an end point of the path: a Steiner point or a leaf (terminal) of an original Steiner tree; and
  III. a route from the start point to the end point: a list of branches.

A subtree collection of FIG. 9 can be divided into five paths p1 to p5 with each path being constituted of such elements. For example, the path p1 has a terminal t1 as a start point of the path, a Steiner point s1 as an end point of the path and a branch e1 as a route between the start point t1 and the end point s1. A path collection generated under setting of Steiner points s1 and s2 are stored as a path list 52 as shown in FIG. 10, wherein the path list 52 expresses a Steiner tree thus generated. A process generating a path collection from a Steiner tree has the number of Steiner points of O(N) and in the process, when the number of branches of the Steiner tree is $e_n$, a calculation time for division to paths is restricted by operation determining whether or not each of terminal points of branches is a Steiner point and the calculation time is $O(e_n^2)$. Furthermore, the number $e_n$ of branches of the Steiner tree is O(N) and a calculation time for division to paths is $O(e_n^2)$. Still furthermore, the number of paths generated is restricted to O(N). Referring again to step S3, if in step S4, a path collection expressing a Steiner tree can be generated, in step 5 performed is correction of the Steiner tree Ti obtained by rerouting a wiring prohibiting region, in step 6 performed is correction of the Steiner tree considering the wiring congested region, furthermore in step S7 performed is line length improvement on the Steiner tree finished with corrections, finally in step S8 performed is allotment of branches to layers, followed by output of the Steiner tree Ti of the net Ni as a wiring source in step S9. Then, the process counter i is incremented by one and thereafter, in step S11 a processing from steps S3 to S9 is repeated till the process counter i finally counts the number n of nets.

Herein, a correcting process for the Steiner tree Ti expressed by a path collection of steps S5 and S6 is performed using the following two correction rules:
(Correction Rule 1)

In the correction rule 1, a start point and end point of a path are changed so as not to increase a line length of the path compared with an original Steiner tree. Along with such a change, routing therebetween is also changed. A prospective point for a new start point comes to be one of points (vertices on a grid graph) on branches of all of Steiner trees traceable from an original start point. Similar to this, a prospective point for a new end point comes to be one of points on branches of all of Steiner trees traceable from an original end point. In order not to increase a line length of a path compared with that of the original Steiner tree, selected is a prospective point such as to meet constraints and have the shortest line length among prospective points for a new start point and a new end point. If such a prospective point is not available, selected is a second prospective point meeting the constraints, wherein a line length becomes longer. After correction of a path, Steiner points are altered since a structure of a Steiner tree is also altered; therefore, recalculation is required on all of paths constituting the Steiner tree. A calculation time required for one path in application of the correction rule 1 is $O(e_n)=O(N)$.

(Correction Rule 2)

In the correction rule 2, a start point and end point of a path are not changed but only routing therebetween is changed so as not to increase a line length of the path compared with an original Steiner tree. In order not to increase a line length of the path owing to change in routing therebetween compared with the original Steiner tree, it is only required that selection is performed of a route passing through a rectangle encircling the start point and end point of the path. If the route cannot pass through the rectangle encircling the start point and end point under constraints such as wiring prohibition, a line length is caused to be longer. A calculation time for application of the correction rule 2 can be restricted to O(1) by predetermining some number of routing patterns in the rectangle encircling the start point and end points.

Figure 11:
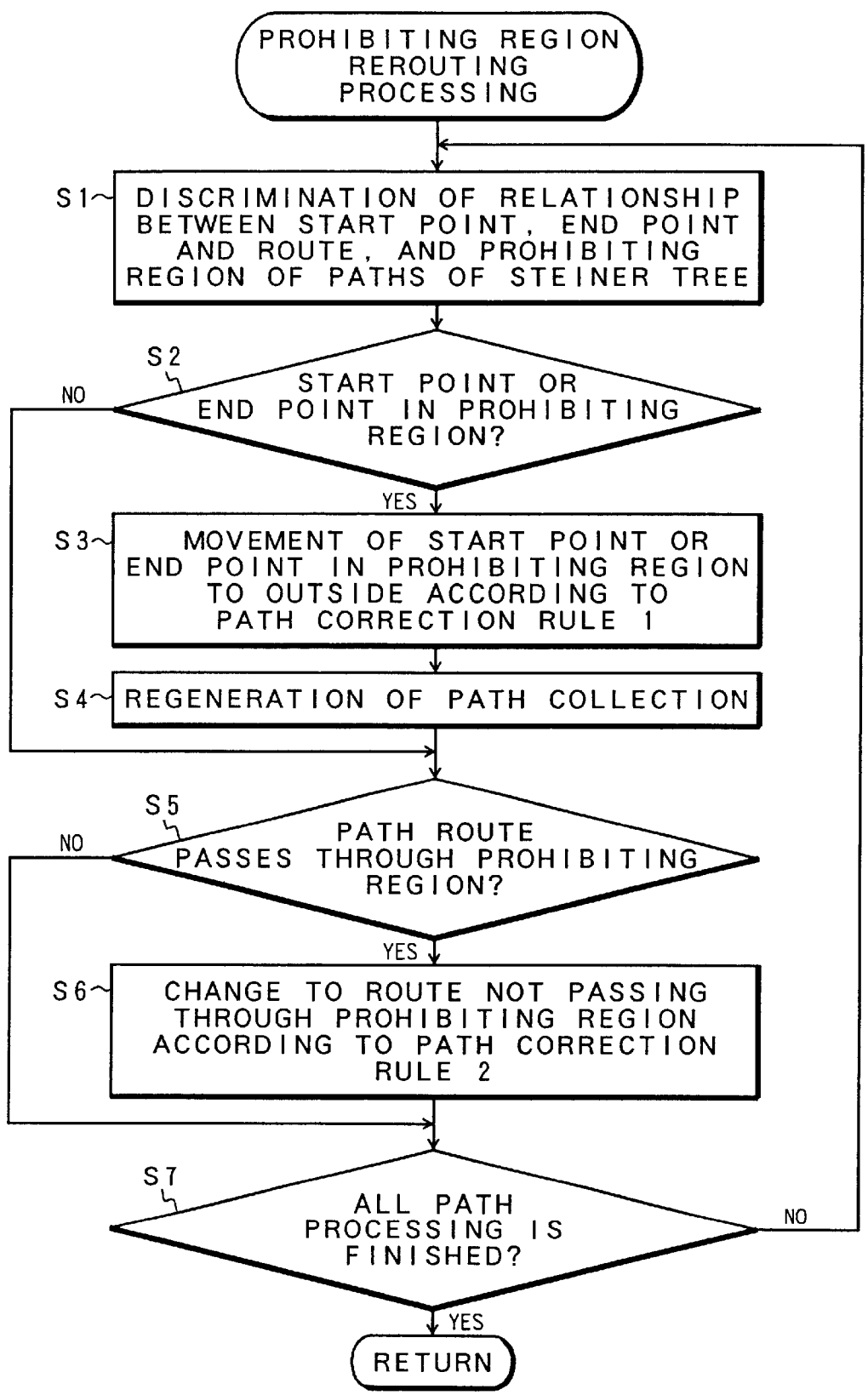
FIG. 11 is a flow chart for prohibiting region rerouting processing of the present invention.

FIG. 11 is a flow chart for a correction process rerouting a wiring prohibiting region of step S5 of FIG. 7. The wiring prohibiting region rerouting processing is realized by functions of the prohibiting region rerouting processing unit 44, the first correcting unit 54 performing a correcting process of the correction rule 1 and the second correction unit 56 performing a correcting process of the correction rule 2, all being provided in the path correcting unit 42 of FIG. 6. First, in step S1, it is determined a relationship between each of start and end points and routing, and a wiring prohibiting region for each of paths of a Steiner tree expressed by a path collection of the path list 52 as shown in FIG. 10, for example. That is, it is checked whether or not the start and end points reside in, and the routing passes through a wiring prohibiting region. If in step S2, it is determined that a start point or end point of a path resides in a prohibiting region, the process advances to step S3, wherein the start point or end point in the prohibiting region is moved outside the prohibiting region according to the path correction rule 1. When the start point or end point is moved, a Steiner tree is altered; therefore, in step S24 performed is renewal to again generate of a path collection. On the other hand, if in step S2, one of the start point and end point of a path does not reside in the prohibiting region, the process advances to step S5, where it is checked whether or not the route of the path passes through the prohibiting region. If not passing through the prohibiting region, the process advances to step S6, where routing is altered to a new one not passing through the prohibiting region according to the correction rule 2. Furthermore, if in step S2, neither a start point nor an end point of a path resides in a prohibiting region and in step S5 the route of the path does not pass through the prohibiting region, then no correction of the path is performed. Processing from step S1 through step S6 is repeated till processing for all of paths of a Steiner tree is completed in step 7.

FIGS. 12A to 12C are descriptive drawings for a concrete process for prohibiting region rerouting processing of the present invention. FIG. 12A shows a Steiner tree expressed by a path collection of the path list 52 of FIG. 10, wherein it is assumed that a path 3 passes through a wiring prohibiting region 62. In order to alter a path p3 passing through the wiring prohibiting region to a path rerouting around the wiring prohibiting region, while not increasing a line length as far as possible, requirement is a change of a start point s1 of the path. Correction accompanying the change of a start point s1 of the path is performed according to the correction rule 1. Prospective points for a new start point according to the correction rule 1 are points on branches of all of Steiner trees traceable from the original start point s1 of the path, that is vertices s11, s12 and s13, and besides terminals t1 and t4 on the grid graph of FIG. 12B. The prospective points s11 is a point meeting a constraint of not passing through the wiring prohibiting region 62, and having the shortest line length among the four new prospective start points t1, s11, s12, s13 and t4. Then, generated is a new path p3 of FIG. 12C having the prospective point s11 as a start point thereof. The path p3 after correction is constituted of the start point s11, an end point s2, branches e41 and e42 and the Steiner point s11 prior to the correction is changed to the Steiner point s11 as a new start point, whereby a structure of the Steiner tree is also changed; therefore, recalculation is performed on all of paths constituting the Steiner tree to renew contents of the path list of FIG. 10. Herein, while in a wiring prohibiting region rerouting process of FIG. 11, correction according to the path correction rule 1 is performed in step S3 under a condition that in step S2, the start point s1 of the path p3 of FIG. 12A resides not in the wiring prohibiting region 62 but outside the wiring prohibiting region 62 and the branch e4 of the path p3 passes through the wiring prohibiting region 62. In order not to change the start point s1, but to change routing of the branch e4 to outside the wiring prohibiting region 62, however, a vertex on the grid graph becoming a prospective point next to the start point s1 has to reside outside the wiring prohibiting region 62. In a case of FIG. 12A, however, a vertex on the grid graph next to the start point s1 resides still in the wiring prohibiting region 62; therefore, the prohibiting region 62 cannot be rerouted by change in routing of the branch e4. Hence, in this case, the start point s1 is changed according to the correction rule 1. That is, in the wiring prohibiting region rerouting process, in a case where a vertex of the grid graph on a branch adjacent to the start point or end point of a path resides in a prohibiting region, then the start point or end point is regarded to reside in the wiring prohibiting region and the correction rule 1 is applied. Regarding the end point s2 of FIG. 12A, the vertex 68 of the grid graph adjacent to the end point s2 on the branch e4 resides outside the wiring prohibiting region 62; therefore, in the case, there arises no requirement for change of the end point s2.

Figure 13B:
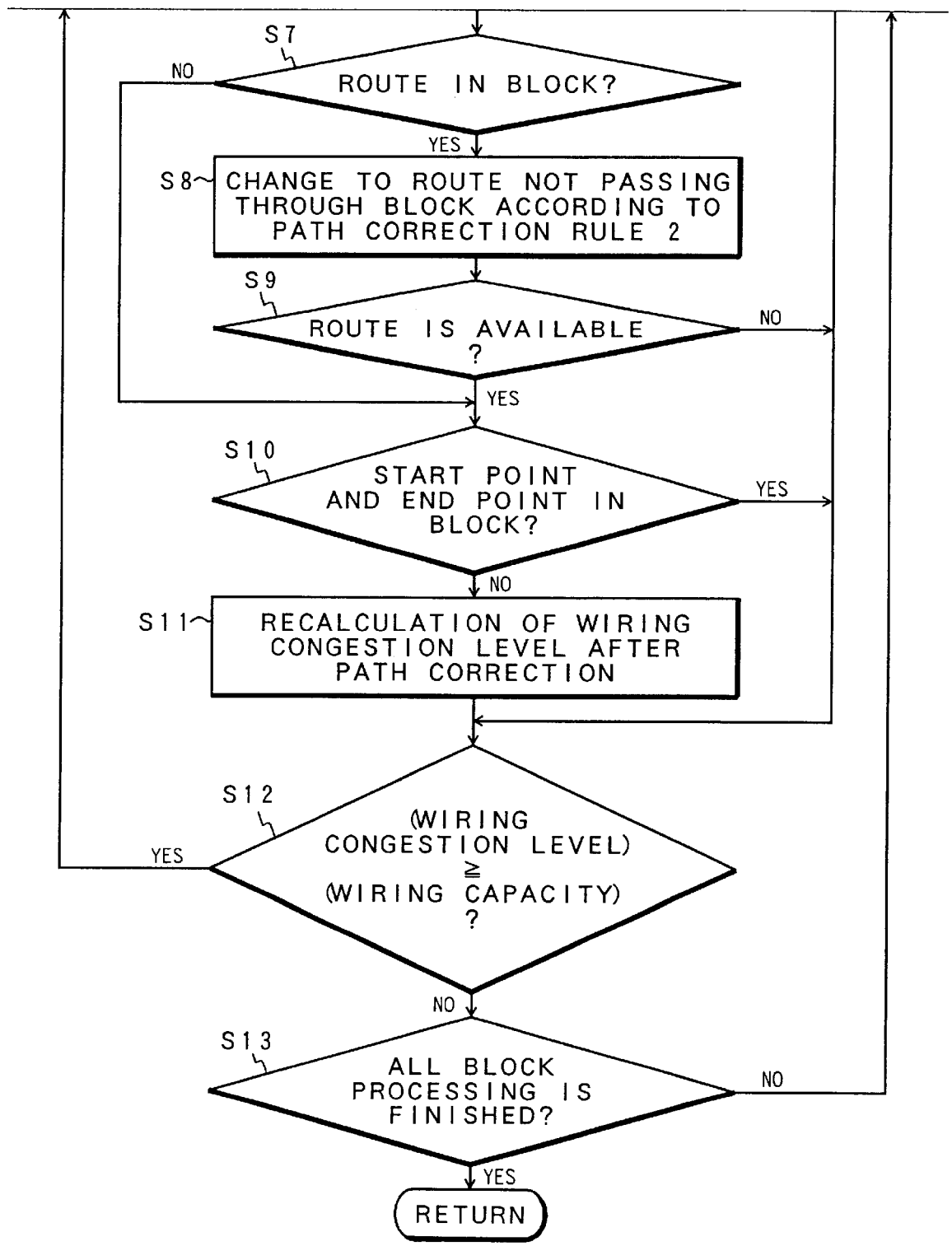

FIGS. 13A and 13B are flow charts for correction processing, that is wire congested region rerouting processing, for a Steiner tree in consideration of the wiring congested region of step S6 of FIG. 7. The wiring congested rerouting processing is realized with the wiring congested region rerouting processing unit 46, the first correcting unit 54 and the second correcting unit 56, all being provided in the path correcting unit 42 of FIG. 6. First, in an initial solution of a Steiner tree as shown in FIG. 8 generated without considering a wiring capacity in step S1, a wiring region thereof is divided into blocks of a proper area and definitions are given of a wiring capacity and a wiring congestion level for each block. While the wiring capacity and the wiring congestion level are defined in various ways according to a nature of a circuit and others, the wiring capacity, for example, is defined as the maximum of wires capable of passing through a block and the wiring congestion level is defined as the number of wires currently passing through a block. Subsequent to this, in step S2, a specific block is taken out and a wiring congestion level and a wiring capacity are compared with each other. If the wiring congestion level exceeds the wiring capacity, the process advances to step S3 to specify a path passing trough the block. In succession, in step S4, it is determined whether or not a start point or end point of the specified path passing through a block in which a wiring congestion level exceeds a wiring capacity is in the block. If being in the block, then the process advances to step S5, where the start point or end point in the block is moved to outside the block according to the path correction rule 1 to change the path to a route not passing through the block. In step S6, it is checked whether or not a route not passing through the block is obtained and if no route not passing through the block is found, the path stays as is originally. On the other hand, if in step S4, a start point or end point resides in the block, the process advances to step S7 of FIG. 13B, where it is determined whether or not the route of the path passes through the block. If the route of the path passes through the block, the process advances to step S8, where the route is changed to a new route not passing through the block according to the path correction rule 2. In this case as well, in step S9 checked is presence or absence of the route not passing through the block and if the route not passing through the block is not found, then the path stays as is originally. Furthermore, if in step S10, a start point and end point of the path both in the block, no change to outside the block can be performed; therefore, no correcting process is performed. In the following step S11, a wiring congestion level of a block currently in process is recalculated on a path after being changed according to the path correction rule 1 of step S5 or the path correction rule 2 of step S8, and in step S12 it is checked whether or not a wiring congestion level recalculated is equal to or more than a wiring capacity. If less than the wiring capacity, wiring congested region rerouting processing for the block is regarded to be completed and in step S13, it is determined whether or not all of the blocks have been processed and if having been processed, then processing from step S2 is again repeated. On the other hand, in step S12, if a wiring congested level recalculated is equal to or more than the wiring capacity, no wiring congestion is solved in the block; therefore, the process returns to step S3, where a next path passing through a block is specified to repeat correction processing from step S4.

Figure 14A:
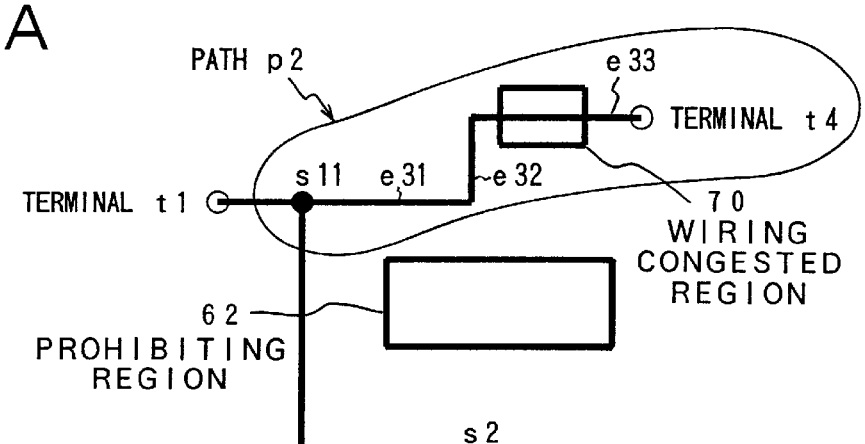
FIGS. 14A to 14C are descriptive drawings for wiring congested region rerouting processing of the present invention.
Figure 14B:
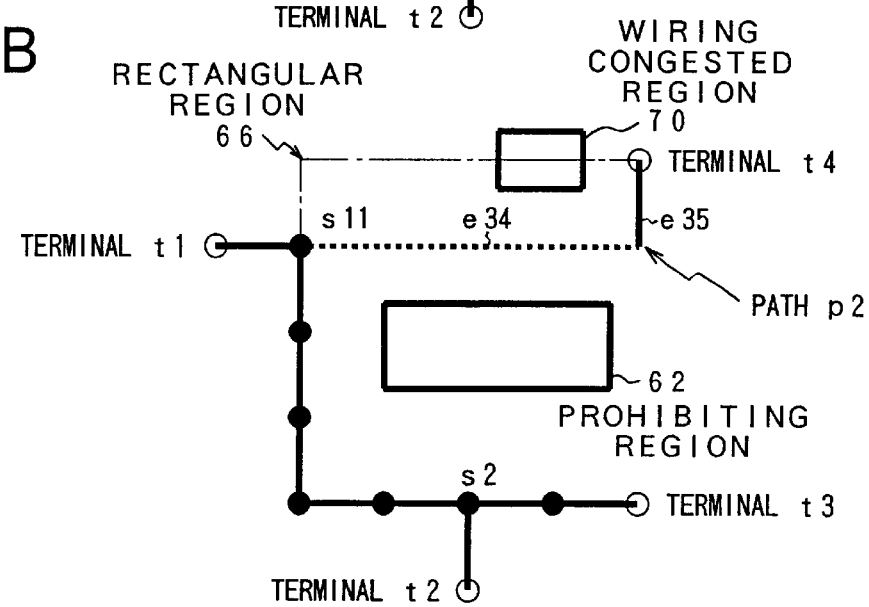
Figure 14C:
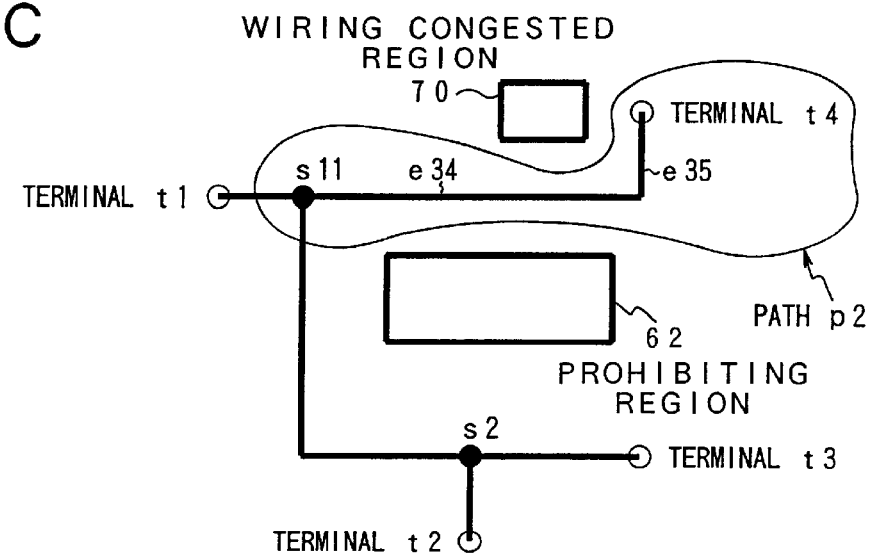

FIGS. 14A to 14C are descriptive drawings for concrete wiring congested region rerouting processing of FIGS. 13A and 13B. FIG. 14A is a Steiner tree 60 in which correction has been made of rerouting processing on the wiring prohibiting region of FIG. 12C, wherein it is assumed that a path p2 passes through a wiring congested region 70. The path p2 passing through the wiring congested region 70 is constituted of a start point s11, and end point t4, branches e31, e32 and e33 and since the start point s11 and end point t4 do not reside in the wiring congested region 70, a route of the path is changed to outside the wiring congested region 70 according to the correction rule 2 so as not to increase a line length as far as possible. In order to change the route of the path p2 to outside the wiring congested region 70 so as not to increase a line length thereof, it is only required that set is a rectangular region 66 including the start point s11 and end point t4 of the path p2 and selected are routes of branches e34 and e35 passing through the rectangular region 66 under a constraint of not passing through the wiring congested region 70. By doing so, the path p2 can be changed to a path not passing through the wiring congested region 70 as shown in FIG. 14C, whereby a congestion level of the wiring congested region 70 can decrease to meet a prescribed wiring capacity.

FIGS. 15A and 15B are flow charts for line length improvement processing of the Steiner tree of step S7 of FIG. 7. The line length improvement processing is realized by a function of the line length improvement processing unit 48 provided in the path correcting unit 42 of FIG. 6. First, in step S1, an arbitrary path p is selected in a Steiner tree to be processed after correction to derive a routing length d. Then, in step S2, a branch belonging to the selected path p is removed and divided into a tree fraction T1 traceable from a start point and a tree fraction T2 traceable from an end point. Thereafter, in step S3, search is performed for a point, as an end point, on a branch among branches of tree fraction T2 with the shortest Manhattan distance from an original start point of path p, wherein a path thus obtained is indicated by p1 and a route length thereof d1, wherein a Manhattan distance means a distance of a straight line connected between two points. In the following step S4, to the contrary, search is performed for a point, as a start point, on a branch among branches of tree fraction T1 with the shortest Manhattan distance from an original end point of path p, where a path thus obtained is indicated by p2 and a route length thereof d2. Then, in step S15, the tree fractions T1 and T2 are separated, in the state if the route length d1 of the path p1 is equal to or less than the route length d2 of the path p2 and in addition equal to or less than a route length d of the original path p for the paths p1 and p2 obtained in respective steps S3 and S4, then the path p1 whose end point has been changed in step S6 is indicated as a new path p whose line length has been improved. If the condition in step S15 is not established, and in addition if in step S7, a condition that the route length d2 of the path p2 obtained in step S4 is less than the route length d1 of the path p1 obtained in step S3 and less than the route length of d of the original path p, then the path p2 whose start point has been changed in step S8 is indicated as a new path p whose route length has been improved. Needless to say that neither of the conditions of respective steps S5 and S7 is established, the original path receives no change in step S9. In step S10, it is checked whether or not all the paths of the Steiner tree have been finished with processing from step S1 to step S9 and the processing from step S1 to step S9 is repeated till processing for all the paths has been completed. Length improvement on the whole circuit is effected by line length improvement processing for each path after correction on a Steiner tree.

Figure 16A:
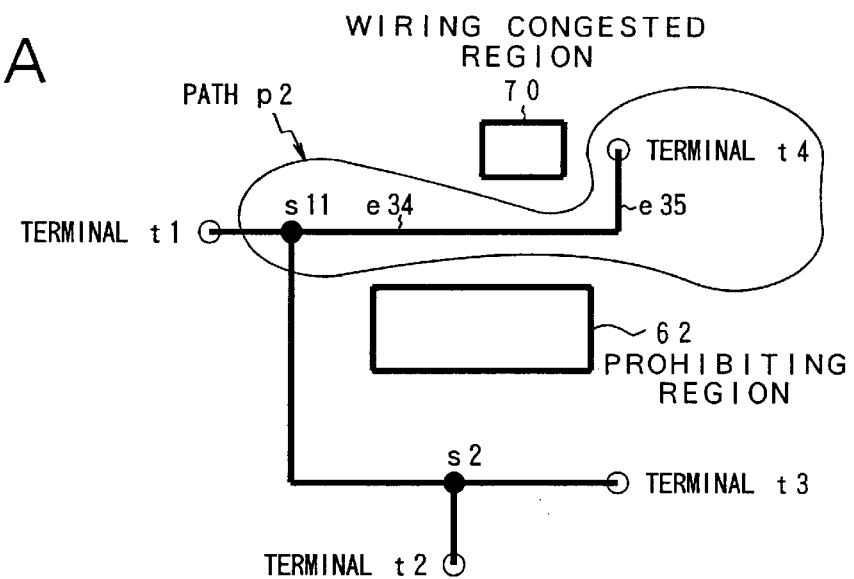
FIGS. 16A to 16C are descriptive drawings for line length improvement processing of the present invention.
Figure 16B:
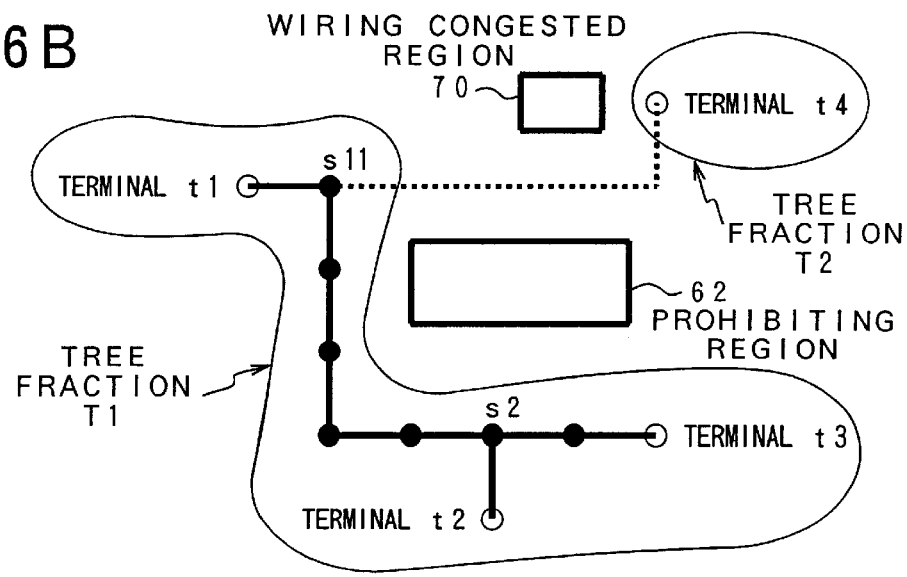
Figure 16C:
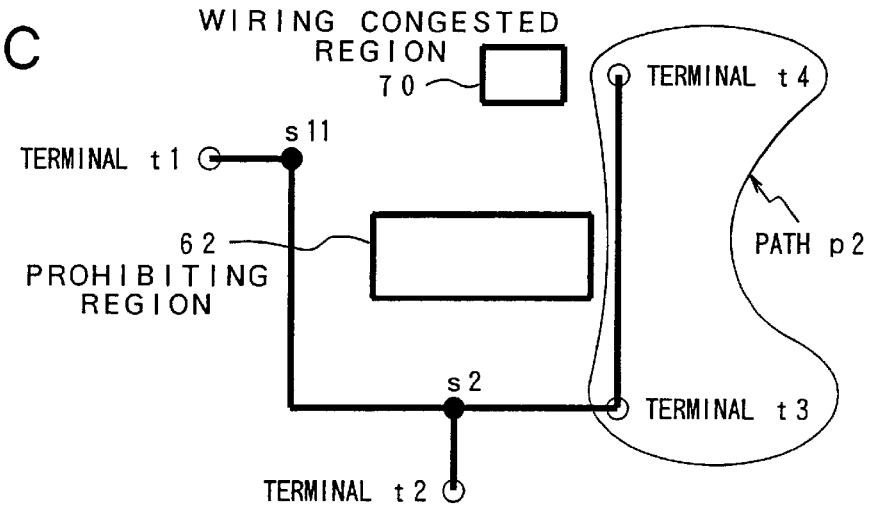

FIGS. 16A to 16C are descriptive drawings for concrete line length improvement processing of FIGS. 15A and 15B. FIG. 16A is a Steiner tree 60 finished with wiring congested region rerouting processing of FIG. 14C. Taking up, as an example, improvement on a path p2 having a route constituted of a start point s11, and end point t4, branches e34 and e35, first the branches e34 and e35 constituting the path p2 are removed as shown with broken lines of FIG. 17B. By removal of the branches e34 and e35, the Steiner tree 60 is divided into a tree fraction T1 of the starting point s11 side and a tree fraction T2 of the end point t4 side. Then, search is performed for a point, as an end point, on a branch among branches of the tree fraction T2 with the shortest Manhattan distance from the original start point s11 of the path p2, wherein a path thus obtained is indicated by p11 and a route length thereof d1. However, the path p11 in this case is the same as the first path p2 of FIG. 16A. Then, search is performed for a point, as a start point, on a branch among branches of the tree fraction T1 of the start point s11 side with the shortest Manhattan distance from the original end point t4 of the path p2. In this case, in the tree fraction T1 of the starting point s11 side, there exist, as prospective points, terminals t1, t2 and t3, Steiner points s11 and s2, and besides points, each indicated by a black circle, each of which is a vertex on a grid graph; therefore, if search is performed for a new start point with the shortest Manhattan distance among the prospective points, then the terminal t3 is searched, wherein thus obtained path is indicated as p2 and a route length thereof d2. In this case, since the route length d2 of the path p22 is less than the route length d1 of the path p11 and in addition, less than the route length d of the original path p2, therefore, the path p22 whose start point has been changed is selected as a new path p2 and line length is improved by changing the path p2 as shown in FIG. 16C.

Figure 17A:
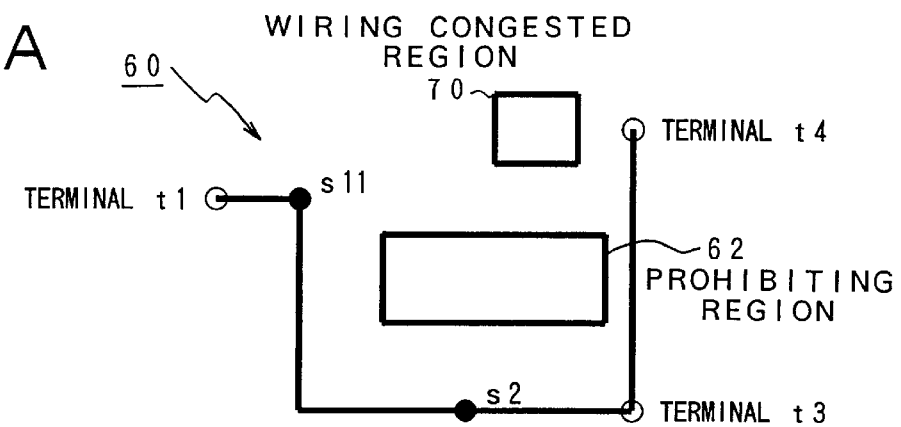
FIGS. 17A and 17B are descriptive drawings for layer placement processing of the present invention.
Figure 17B:
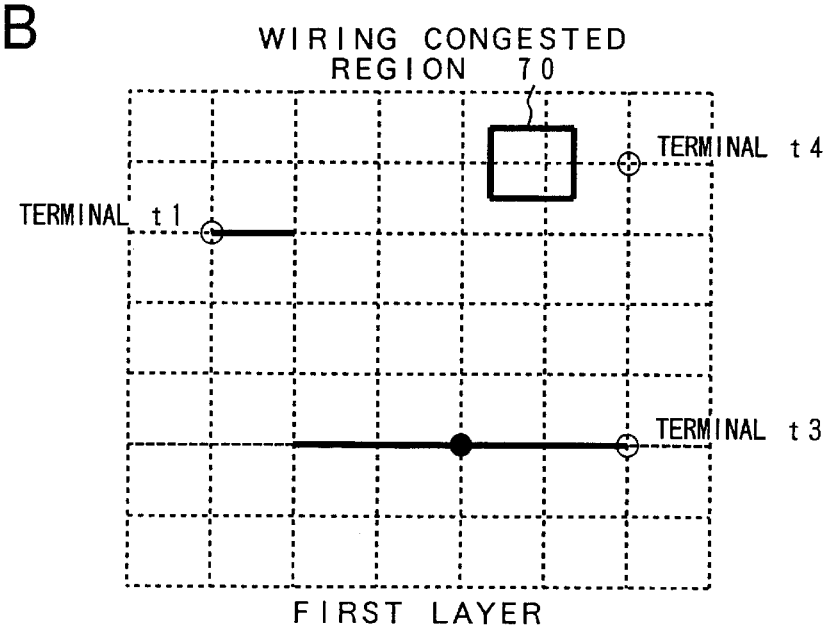
Figure 17C:
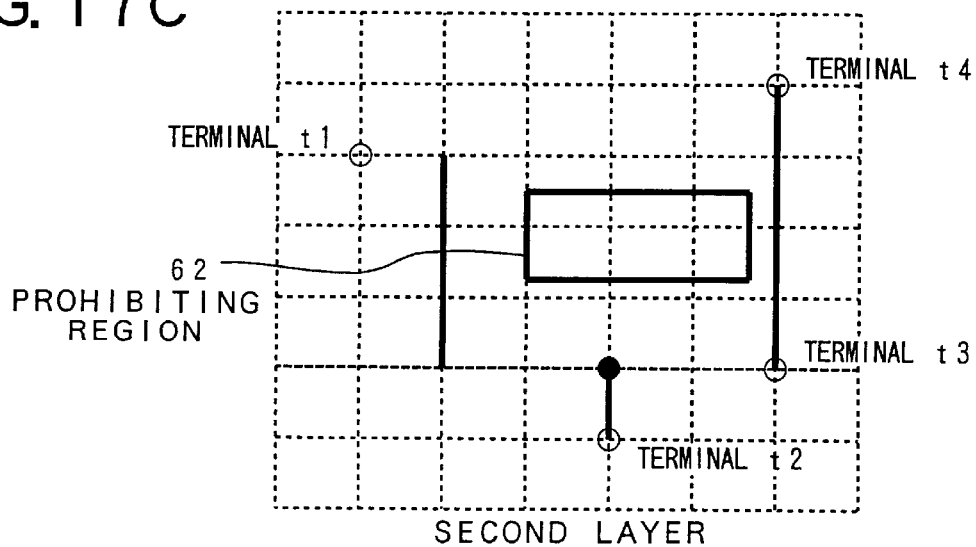

FIGS. 17A and 17C are concrete examples of allotment processing of branches to layers performed after partial correction for and line improvement on a Steiner tree in step S8 of FIG. 7. The allotment processing is performed by a function of the layer placement processing unit 50 provided in the path correcting unit 42 of FIG. 6. FIG. 17A is a Steiner 60 on which line length improvement has been performed of FIG. 16C. The Steiner tree 60 is allotted to a first layer as shown in FIG. 17B and to a second layer as shown in FIG. 17C based on layer information inputted in advance and based on the allotment, a solution of global routing for wiring trees T1 to Tn of nets N1 to Nn is outputted to the output unit 30 of FIG. 6.

Note that in the above described embodiment, a partial correction is performed on an initial solution of a Steiner tree having been generated without any of constrains, in consideration of a wiring prohibiting region and a wiring capacity and thereafter subjected to line improvement and finally layer placement is performed, but even when correction of a Steiner tree is performed only in consideration of specific constraints such as rerouting of a wiring prohibiting region or a wiring capacity, a load in the following detailed routing processing can be alleviated. Furthermore, the present invention provides a storage medium, readable by a computer, having a global routing program stored therein, the program being provided with a procedure for global routing processing shown in the above described embodiment. In the global routing program stored in the storage medium, processing functions of respective units of the global routing apparatus 20 of FIG. 6 are incorporated as modules. Besides, the present invention includes proper modifications or alterations of the embodiment without degrading the object and advantages thereof, and moreover, the present invention is not limited by numerical values shown in the examples.

Industrial Applicability

According to the present invention, as described above, by performing partial correction on a Steiner tree as an initial solution in consideration of constraints, a result with the same quality as global routing obtained in consideration of an obstacle in an existing maze method can be obtained as a solution of global routing using a Steiner tree. Thereby, no necessity arises of processing in consideration of constraints such as layers, prohibition and a wiring capacity in a subsequent detailed routing; therefore, a processing load is alleviated in the detailed routing, a calculation time is reduced as a whole, thus enabling realization of a faster automatic design.

Furthermore, a calculation required for partial correction of a Steiner tree of the present invention is coordinate calculation, and a calculation time and a used memory amount is dependent on a number related to a net and is more advantageous in calculation time and used memory amount compared with a maze method whose calculation time and used memory capacity are dependent on a grid size, with a result that global routing with less of a calculation time and less of a used memory amount can be realized in the present invention.

What is claimed is:

1. A global routing method obtaining global routing between net terminals of cells placed on a chip, comprising:
generating a Steiner tree having been generated without any constraints as an initial solution; and repeating partial correction of said Steiner tree so as not to increase a line length as far as possible in consideration of said constraints based on said initial solution of said Steiner tree to obtain said global routing.

2. The method of claim 1, wherein the constraints include at least one of layers, prohibition and a wiring capacity and wherein said repeating is in consideration of at least one of a prohibiting region, a wiring capacity and layers.

3. The method of claim 2, wherein said correcting further comprises:
generating a path collection obtained by dividing said Steiner tree into a plurality of paths each having at least a Steiner point, as a value, being an intersection of 3 or more branches; and
partially correcting said Steiner tree by correcting a path in consideration of said constraints for said path collection of said Steiner tree.

4. The method of claim 3, wherein the path correcting further comprises prohibiting region rerouting by changing a path passing through said prohibiting region to a path not passing through said prohibiting region for said path collection of said Steiner tree.

5. The method of claim 4, wherein said prohibiting region rerouting further comprises:
determining whether a start point or end point of a path resides in or a route thereof passes through said prohibiting region;
if neither residing in nor passing through said prohibiting region, then terminating the process;
if said start point or end point of said path resides in said prohibiting region, then moving said start point or end point to outside said prohibiting region and thereafter, renewing said path collection, or if neither being found outside said prohibiting region, then changing no path and terminating the process; and
if said path passes through said prohibiting region, then changing a route thereof so as not pass through said prohibiting region.

6. The method of claim 5, wherein said prohibiting region rerouting further comprises:
first correcting, when a start point in said prohibiting region is moved to outside thereof, selecting points on branches of said Steiner tree traceable from an original start point as prospective points for a new start point of a movement destination or selecting points on all branches of said Steiner tree traceable from an original end point as prospective points for a new end start of a movement destination, and selecting a prospective point, being outside said prohibiting region, and having the shortest line length among said prospected points as a start point or endpoint to change a path; and
second correcting, when a route passes through said prohibiting region, changing a path selecting a route passing through a space outside said prohibiting region without changing both of said start and end points so as not to increase a line length as far as possible.

7. The method of claim 3, wherein the correcting a path comprises congested-wiring-region rerouting by changing a path passing through a wiring congested region having the number of wires exceeding a wiring capacity to a path not passing through the wiring congested region so as to ensure the number of wires equal to or less than the wiring capacity in the wiring congested region.

8. The method of claim 7, wherein said congested-wiring-region rerouting comprises:
defining a wiring capacity indicating the maximum of the number of wires capable of passing through each of blocks obtained by dividing a wiring region into the blocks each of a prescribed area and a wiring congestion level indicating the number of wires currently passing through each of the blocks;
if a wiring congestion level of a block is equal to or less than a wiring capacity thereof, then terminating the process;
if a wiring congestion level of a block exceeds a wiring capacity thereof, then changing a first path whose start point and end point are outside a block, and passing through the block to a second path finding a route not passing through said block without changing said start point and end point of said first path, or if no route not passing through said block is found, maintaining said first path as is originally;
if one of a start point and end point of a path resides within a block and the other resides outside the block, changing said path finding a terminal point outside said block instead of a terminal point within said block and thereby finding a route not passing through said block, or if neither said terminal point nor said route is found, maintaining said path as is originally;
if both of a start point and end point of a path resides in a block, maintaining said path as is originally; and
after said path is corrected, recalculating a wiring congestion level of said block and repeating the process till said wiring congestion level thereof decreases to a value equal to or less than a wiring capacity thereof.

9. The method of claim 8, wherein said congested-wiring-region rerouting further comprises:
first correcting, when a start point or end point of a path resides in said block, selecting points on branches of a Steiner tree traceable from an original start point or end point as prospect points for a new start point or new end point of a movement destination, and changing a path selecting a prospect point, being outside said block, and having the shortest line length among said prospective points for said new end point or end point to find a route not to passing through said block; and
second correcting, when a route passes through said block, changing a path selecting a route passing through a space outside said block so as not to increase a line length as far as possible without changing a start point and end point thereof.

10. The method of claim 3, wherein the path correcting comprises improving a line length of a path by changing the path so as to improve the line length of the path after partial correction of a Steiner tree under said constrains for a path collection of said Steiner tree.

11. The method of claim 10, wherein the improving a line length further comprises:
removing branches belonging to a path to be processed from a Steiner tree to divide said branches into a first tree fraction T1 which is a collection of branches traceable from a start point and a second tree fraction T2 which is a collection of branches traceable from an end point;
generating a first prospective path finding an end point on a branch, having the shortest Manhattan distance, among said branches of said tree fraction T2 from an original start point of said first tree fraction T1;
generating a second prospective path finding a start point on a branch, having the shortest Manhattan distance, among said branches of said tree fraction T1 from an original end point of said second tree fraction T2;

if a distance d1 of said first prospective path is equal to or less than a distance d2 of said second prospective path and equal to or less than a distance d of said pass to be processed, renewing a path collection with said first prospective path whose end point has been changed as a new path;

if a distance d2 of said second prospective path is equal to or less than a distance d1 of said first prospective path and equal to or less than a distance d of said pass to be processed, renewing said path collection with said second prospective path whose end point has been changed as a new path; and if distances d1 and d2 of said first and second prospective paths, respectively, are equal to or more than a distance of said path to be processed, maintaining said path as is originally without changing a start point and end point thereof.

12. A global routing apparatus acquiring global routing between net terminals of cells placed on a chip comprising:

a Steiner tree generating unit generating a Steiner tree having been generated without any constraints including at least one of layers, prohibition and a wiring capacity as an initial solution;

a path collection generating unit generating a path collection obtained by dividing said Steiner tree into a plurality of paths each having at least a Steiner point, as a value, being an intersection of three or more branches; and a path correcting unit obtaining global routing by repeating partial correction of said Steiner tree with correction of a path in consideration of said constraints so as not to increase a line length as far as possible for said path collection of said Steiner tree.

13. The apparatus of claim 12, wherein said path correcting unit comprises:

a prohibiting region rerouting processing unit changing a path passing through a prohibiting region to a path not passing through said prohibiting region for said path collection of said Steiner tree;

a wiring congested region rerouting processing unit changing a path passing through a wiring congested region having the number of wires exceeding a wiring capacity to a path not passing through said wiring congested region so as to ensure the number of wires equal to or less than said wiring capacity in said wiring congested region for said path collection of said Steiner tree; and a line length improvement processing unit changing a path so as to improve a line length of said path after partial correction of said Steiner tree under said constraints for said path collection of said Steiner tree.

14. A storage medium, readable by a computer, having a global routing program stored therein, said program acquiring global routing between net terminals of cells placed on a chip, comprising:

a Steiner tree generating module generating a Steiner tree having been generated without any constraints including at least one of layers, prohibition and a wiring capacity as an initial solution;

a path collection generating module generating a path collection obtained by dividing said Steiner tree into a plurality of paths each having at least a Steiner point, as a value, being an intersection of three or more branches; and a path correcting module obtaining global routing repeating partial correction of said Steiner tree with correction of a path in consideration of said constraints so as not to increase a line length as far as possible for said path collection of said Steiner tree.

15. The storage medium of claim 14, wherein said path correcting module comprises:

a prohibiting region rerouting processing module changing a path passing through a prohibiting region to a path not passing through said prohibiting region for said path collection of said Steiner tree;

a wiring congested region rerouting processing module changing a path passing through a wiring congested region having the number of wires exceeding a wiring capacity to a path not passing through said wiring congested region so as to ensure the number of wires equal to or less than said wiring capacity in said wire congested region for said path collection of said Steiner tree; and a line length improvement processing module changing a path so as to improve a line length of said path after partial correction of said Steiner tree under said constraints for said collection of said Steiner tree.

* * * * *